US009142554B2

(12) United States Patent
Chen et al.

(10) Patent No.: US 9,142,554 B2
(45) Date of Patent: Sep. 22, 2015

(54) SEMICONDUCTOR DEVICE AND DRIVER CIRCUIT WITH AN ACTIVE DEVICE AND ISOLATION STRUCTURE INTERCONNECTED THROUGH A DIODE CIRCUIT, AND METHOD OF MANUFACTURE THEREOF

(71) Applicants: Weize Chen, Phoenix, AZ (US); Hubert M. Bode, Haar (DE); Richard J. De Souza, Chandler, AZ (US); Patrice M. Parris, Phoenix, AZ (US)

(72) Inventors: Weize Chen, Phoenix, AZ (US); Hubert M. Bode, Haar (DE); Richard J. De Souza, Chandler, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 45 days.

(21) Appl. No.: 13/671,503

(22) Filed: Nov. 7, 2012

(65) Prior Publication Data

US 2014/0001548 A1  Jan. 2, 2014

Related U.S. Application Data

(63) Continuation-in-part of application No. 13/538,565, filed on Jun. 29, 2012.

(51) Int. Cl.
*H01L 29/78* (2006.01)
*H01L 21/76* (2006.01)
(Continued)

(52) U.S. Cl.
CPC .......... *H01L 27/0727* (2013.01); *H01L 21/761* (2013.01)

(58) Field of Classification Search
CPC ................ H01L 21/76; H01L 29/0653; H01L 29/66659; H01L 29/7835
See application file for complete search history.

(56) References Cited

U.S. PATENT DOCUMENTS

| 5,156,989 A | 10/1992 | Williams et al. |
| 5,257,175 A | 10/1993 | Skelton et al. |
| 5,889,310 A | 3/1999 | Terashima et al. |

(Continued)

FOREIGN PATENT DOCUMENTS

| EP | 2680299 A2 | 1/2014 |
| EP | 2731144 A2 | 5/2014 |

OTHER PUBLICATIONS

U.S. Appl. No. 13/538,565, Office Action—Restriction, mailed May 7, 2014.

(Continued)

*Primary Examiner* — Caleb Henry
*Assistant Examiner* — Mounir Amer
(74) *Attorney, Agent, or Firm* — Sherry W. Schumm

(57) ABSTRACT

Embodiments of semiconductor devices and driver circuits include a semiconductor substrate having a first conductivity type, an isolation structure (including a sinker region and a buried layer), an active device within area of the substrate contained by the isolation structure, and a diode circuit. The buried layer is positioned below the top substrate surface, and has a second conductivity type. The sinker region extends between the top substrate surface and the buried layer, and has the second conductivity type. The active device includes a body region of the second conductivity type, and the diode circuit is connected between the isolation structure and the body region. The diode circuit may include one or more Schottky diodes and/or PN junction diodes. In further embodiments, the diode circuit may include one or more resistive networks in series and/or parallel with the Schottky and/or PN diode(s).

8 Claims, 19 Drawing Sheets

(51) Int. Cl.
*H01L 27/07* (2006.01)
*H01L 21/761* (2006.01)

(56) References Cited

U.S. PATENT DOCUMENTS

| | | | |
|---|---|---|---|
| 6,288,424 | B1 | 9/2001 | Ludikhuize |
| 6,573,562 | B2 | 6/2003 | Parthasarathy et al. |
| 6,727,547 | B1 | 4/2004 | Brisbin et al. |
| 6,784,489 | B1 | 8/2004 | Menegoli |
| 7,064,407 | B1 * | 6/2006 | Mallikarjunaswamy ..... 257/471 |
| 7,141,860 | B2 | 11/2006 | Khemka et al. |
| 7,439,584 | B2 * | 10/2008 | Khemka et al. ............... 257/341 |
| 2003/0080381 | A1 * | 5/2003 | Parthasarathy et al. ....... 257/338 |
| 2003/0127687 | A1 | 7/2003 | Kumagai et al. |
| 2006/0011974 | A1 | 1/2006 | Pendharkar |
| 2006/0261408 | A1 | 11/2006 | Khemka et al. |
| 2009/0267110 | A1 | 10/2009 | Cai |
| 2009/0294849 | A1 | 12/2009 | Min et al. |
| 2011/0057262 | A1 | 3/2011 | Ma et al. |
| 2011/0101425 | A1 | 5/2011 | Grote et al. |
| 2011/0187475 | A1 | 8/2011 | Kim et al. |
| 2011/0241083 | A1 | 10/2011 | Khemka et al. |
| 2012/0175673 | A1 | 7/2012 | Lee |
| 2014/0001473 | A1 | 1/2014 | Chen et al. |

OTHER PUBLICATIONS

U.S. Appl. No. 13/538,565, Office Action—Rejection, mailed Jul. 18, 2014.
U.S. Appl. No. 13/538,577, Office Action—Restriction, mailed May 14, 2014.
U.S. Appl. No. 13/671,506, Office Action—Restriction, mailed May 16, 2014.
U.S. Appl. No. 13/538,529, Office Action—Rejection, mailed Jul. 18, 2014.
U.S. Appl. No. 13/538,577, Bode, H.M., Office Action—Rejection, mailed Sep. 22, 2014.
EP 13172894.1, European Extended Search Report mailed Nov. 3, 2014.
EP 13191777.5, European Extended Search Report mailed Dec. 2, 2014.
EP 13173226.5, European Extended Search Report mailed Dec. 8, 2014.
U.S. Appl. No. 13/671,506, Bode, H. M., Office Action—Rejection, mailed Sep. 23, 2014.
U.S. Appl. No. 13/538,529, Office Action—Restriction, mailed Feb. 12, 2015.
U.S. Appl. No. 13/538,577, Office Action—Final Rejection, mailed Jan. 23, 2015.
U.S. Appl. No. 13/671,506, Office Action—Final Rejection, mailed Feb. 25, 2015.
U.S. Appl. No. 13/538,565, Office Action—Restriction, mailed Feb. 18, 2015.
Notice of Allowance mailed Jun. 22, 2015 for U.S. Appl. No. 13/538,529, 8 pgs.
Non-Final Rejection mailed May 8, 2015 for U.S. Appl. No. 13/538,577, 13 pgs.
Non-Final Rejection mailed May 19, 2015 for U.S. Appl. No. 13/671,506, 12 pgs.
Notice of Allowance mailed Jun. 22, 2015 for U.S. Appl. No. 13/538,565, 8 pgs.
Extended European Search Report mailed Jun. 26, 2015 for corresponding EP Application No. EP 13191789, 9 pages.

* cited by examiner

SEMICONDUCTOR DEVICE AND DRIVER CIRCUIT WITH AN ACTIVE DEVICE AND ISOLATION STRUCTURE INTERCONNECTED THROUGH A DIODE CIRCUIT, AND METHOD OF MANUFACTURE THEREOF

RELATED APPLICATION

This application is a continuation-in-part of co-pending, U.S. patent application Ser. No. 13/538,565, filed on Jun. 29, 2012, and assigned to the same assignee as the present application.

TECHNICAL FIELD

Embodiments generally relate to semiconductor devices and their manufacturing methods, and more particularly relate to laterally diffused metal oxide semiconductor (LD-MOS) devices with isolation structures.

BACKGROUND

In some system-on-a-chip (SOC) applications that include an inductive load, certain nodes may experience a negative potential during switching, which may lead to significant injection current into the substrate. The charged carriers injected into the substrate may disturb adjacent circuits and adversely affect their operation.

Accordingly, there is an ongoing need for improved device structures, materials and methods of fabrication that can overcome this difficulty and provide improved performance. It is further desirable that the methods, materials, and structures employed be compatible with present day manufacturing capabilities and materials and not require substantial modifications to available manufacturing procedures or substantial increases in manufacturing costs. Furthermore, other desirable features and characteristics of the various embodiments will become apparent from the subsequent detailed description and the appended claims, taken in conjunction with the accompanying drawings and the foregoing technical field and background.

BRIEF DESCRIPTION OF THE DRAWINGS

Embodiments will hereinafter be described in conjunction with the following drawing figures, wherein like numerals denote like elements.

DETAILED DESCRIPTION

Figure 1:
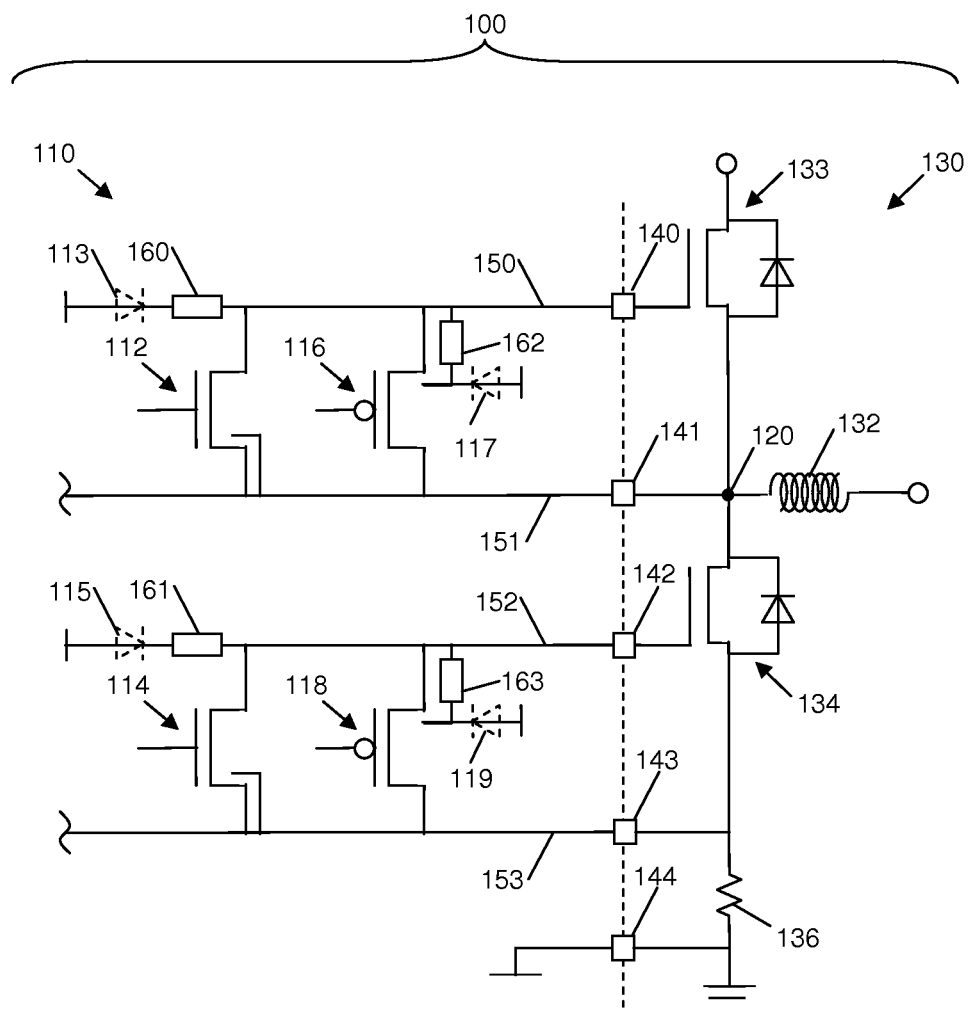
FIG. 1 is a simplified diagram of an electronic system that includes a driver circuit configured to drive an external circuit that includes an inductive load, according to an embodiment.

The following detailed description is merely exemplary in nature and is not intended to limit the embodiments or the application and uses of the various embodiments. Furthermore, there is no intention to be bound by any expressed or implied theory presented in the preceding technical field or background, or the following detailed description.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second" opposite conductivity type", wherein the first conductivity type may be either N or P type and the second opposite conductivity type is then either P or N type, and so forth. Further, for convenience of explanation and not intended to be limiting, various embodiments of the present invention are described herein for silicon semiconductors, but persons of skill in the art will understand the invention is not limited to silicon but applies to a wide variety of semiconductor materials. Non-limiting examples are other type IV semiconductor materials, as well as type III-V and II-VI semiconductor materials, organic semiconductor materials and combinations thereof, whether in bulk form or in layered form or in thin film form or semiconductor-on-insulator (SOI) form or combinations thereof. Such materials may be single-crystal or poly-crystalline or amorphous or combinations thereof.

FIG. 1 is a simplified diagram of an electronic system 100 that includes a driver circuit 110 configured to drive an external circuit 130 that includes an inductive load 132, according to an embodiment. System 100 may be implemented in an automobile or other vehicle, where the inductive load 132 represents a portion of a motor, or other inductive component of the vehicle. Alternatively, system 100 or derivations thereof may be used in applications other than automotive or vehicular applications.

According to an embodiment, driver circuit 110 is part of a system-on-a-chip (SOC), where the driver circuit 110 and other portions of the SOC are formed on a single semiconductor substrate (referred to below as the "SOC substrate"). For example, the SOC also may include various processing components, memory arrays (e.g., flash arrays, static random access memory (SRAM) arrays, and so on), and other circuitry. For simplicity, other portions of the SOC are not illustrated in FIG. 1. As will be explained in more detail below, embodiments relate to systems and semiconductor components that are configured to reduce or eliminate undesirable current from being injected into the SOC substrate from the inductive load 132 or other sources.

Driver circuit 110 and other portions of the SOC are coupled with the external circuit 130 via at least "high side gate" (HG) pin 140, "high side source" (HS) pin 141, "low side gate" (LG) pin 142, "low side source" (LS) pin 143, and ground pin 144. Although referred to as "pins" herein, pins 140-144 may include any combination of pins, leads, bumps, balls, or other types of contacts. In FIG. 1, the vertical, dashed line through pins 140-144 represents the division between the SOC (including driver circuit 110) and the external circuit 130.

As mentioned above, external circuit 130 includes an inductive load 132. In addition, external circuit 130 includes a first "high side" FET 133, a second "low side" FET 134, and a shunt resistor 136, in an embodiment. As will be explained in more detail later, under certain circumstances, inductive load 132 may function as a source of injected current, which couples to the driver circuit 110. The high side FET 133 and the low side FET 134 each include a body diode, as shown in FIG. 1. HS pin 141 is coupled to an input terminal of the inductive load 132, the source of high side FET 133, and the drain of low side FET 134 at node 120. The source of low side FET 134 is coupled to LS pin 143 and to ground through shunt resistor 136. The gate of high side FET 133 is coupled to HG pin 140, and high side FET 133 is turned on and off in response to signals received from driver circuit 110 through HG pin 140. The gate of low side FET 134 is coupled to LG pin 142, and low side FET 134 is turned on and off in response to signals received from driver circuit 110 through LG pin 142.

According to an embodiment, driver circuit 110 includes, along a first current path, at least a first N-type LDMOS field effect transistor (NLDMOSFET) 112 and at least a first P-type LDMOSFET (PLDMOSFET) 116. Node 150 couples the drain of NLDMOSFET 112 and the source and body of PLDMOSFET 116 to HG pin 140. Node 151 couples the source and body of NLDMOSFET 112 and the drain of PLDMOSFET 116 to HS pin 141. Along a second current path, driver circuit 110 also may include a second NLDMOSFET 114 and a second PLDMOSFET 118. Node 152 couples the drain of NLDMOSFET 114 and the source and body of PLDMOSFET 118 to LG pin 142. Node 153 couples the source and body of NLDMOSFET 114 and the drain of PLDMOSFET 118 to LS pin 143. The SOC substrate is connected to system ground through ground pin 144.

As will be explained in more detail later in conjunction with the other figures, the active areas of PLDMOSFETs 116 and 118 each may be formed within an isolation structure or isolation "tub" (e.g., an N-type buried layer and N-type sinker region that surrounds the active area). In addition, the active areas of NLDMOSFETS 112 and 114 each similarly may be formed within an isolation structure. The isolation structures are configured to isolate the active areas of NLDMOSFETs 112 and 114 and PLDMOSFETs 116 and 118 from the remainder of the SOC substrate. The isolation structures may allow NLDMOSFETs 112 and 114 and PLDMOSFETs 116 and 118 to operate with a body bias. In addition, the isolation structures may help to prevent current injection into the SOC substrate under normal operating conditions. For example, in FIG. 1, diodes 113 and 115 represent buried layer-to-substrate diodes associated with NLDMOSFETs 112 and 114, and diodes 117 and 119 represent buried layer-to-substrate diodes associated with PLDMOSFETs 116 and 118, where the diodes 113, 115, 117, and 119 allow pins 141-143 to be at positive potentials without shorting to the SOC substrate.

In some systems, the sources of PLDMOSFETs 116 and 118 and their associated isolation structures are electrically shorted through metallization so that the source electrodes and the isolation structures always are at a same potential. In addition, in the PLDMOSFETs 116 and 118, the body region may be merged with the isolation structure at or below the substrate surface, in which case the isolation structure (or more specifically the N-type sinker region) may be considered to be a body tie. The source region and body region typically are held at high potentials (e.g., Vdd), and shorting the sources with the isolation structures while merging the isolation structure and the body region enables the portion of the substrate between the body region and the N-type buried layer to better sustain full reverse bias at maximum Vdd. Similarly, the drains of NLDMOSFETs 112 and 114 and their associated isolation structures may be electrically shorted through metallization so that the drain electrodes and the isolation structures always are at a same potential. This arrangement is beneficial because, in the NLDMOSFETs 112 and 114, the substrate material between the drift region and each isolation structure's buried layer may not be able to sustain a full reverse bias at maximum Vdd from both the drift region and the buried layer.

While shorting together the current carrying regions (e.g., drain regions of the NLDMOSFETs 112 and 114, and source regions of the PLDMOSFETs 116 and 118) to the isolation structures of NLDMOSFETs 112 and 114 and the body of PLDMOSFETs 116 and 118, respectively, may work well under many operating conditions, this arrangement may allow undesirable current to be injected into the substrate of the SOC under certain other operating conditions. For example, at the moment that the driver circuit 110 turns the high side FET 133 off (e.g., by turning on NLDMOSFET 112), the low side FET 134 also is off (e.g., NLDMOSFET 114 is conducting). In this state, the current in the inductive load 132 may push the HS pin 141 negative until the body diode of the low side FET 134 is forward biased. The driver circuit 110 may be controlled to turn on the low side FET 134 in order to lower the power dissipation of the low side FET 134 some time later. Then, the negative potential at node 120 and the HS pin 141 (and thus the source and body of NLDMOSFET 112) is defined by the inductive load current times the sum of the resistance of shunt resistor 136 and the RDSON of the low side FET 134. On the LS pin 143 (and the source and body of NLDMOSFET 114), a lesser negative potential is defined by the inductive load current times the resistance of the shunt resistor 136. For a while after the high side FET 133 is turned off, the NLDMOSFETs 112 and 114 have positive gate-source voltages (Vgs), thus causing the drains to short with the sources of NLDMOSFETs 112 and 114. In systems in which the drain electrodes and isolation structures of NLDMOSFETs 112 and 114 are merely shorted, the negative potentials on the HS pin 141 and the LS pin 143 may then access nodes 150, 152 and at least two injecting sites (N-type areas) in the SOC substrate through the conducting channels of NLDMOSFETs 112 and 114. Because the negative potential on the HS pin 141 is greater than the negative potential on the LS pin 143, the potential for current injection as a result of the negative potential on the HS pin 141 is a larger issue than the potential for current injection as a result of the negative potential on the LS pin 143. To avoid the high power dissipation in the body diode of low side FET 134 for an extended period of time, low side FET 134 is turned on (i.e., by turning off NLDMOSFET 114) shortly after the high side FET 133 is turned off. However, the potential at node 120 (and thus HS pin 141) will still be negative, and the issue of current injection may still exist, although to a lesser extent.

According to various embodiments, driver circuit 110 includes further circuitry configured to reduce or eliminate current injection into the SOC substrate under the above-described or other operating conditions. More particularly, in an embodiment, driver circuit 110 includes a first diode circuit 160 coupled between the drain region and the isolation structure of NLDMOSFET 112, a second diode circuit 161 coupled between the drain region and the isolation structure of NLDMOSFET 114, a third diode circuit 162 coupled between the source region and the isolation structure of PLDMOSFET 116, and a fourth diode circuit 163 coupled between the source region and the isolation structure of PLDMOSFET 118. By inserting the diode circuits 160-163 at these locations, the injection current can be reduced or eliminated. More specifically, the injection sites are moved behind diode circuits 160-163, thus significantly limiting the current that may be injected into the SOC substrate at a given potential on the HS pin 141 and/or the LS pin 143. For example, during high side turn off in the context of normal operations, the voltage on the HS pin 141 may swing negative between about −0.3 volts and −6.0 volts (or some other normal operating value). According to various embodiments, diode circuits 160-163 may include diodes with breakdown voltages that are less than, greater than, or equal to the lowest normal negative operating voltage, depending on the application. Although not illustrated in FIG. 1, driver circuit 110 may include additional NLDMOSFET and/or PLDMOSFET devices, which also include diode circuits coupled between their drain or source regions and isolation structures for the purpose of reducing or eliminating current injection into the SOC substrate.

As used herein, a "diode circuit" is a circuit that includes one or more diodes. As will be described in more detail later in conjunction with the remaining figures, a "diode" may be formed from a Schottky contact and a doped semiconductor region, a PN junction, a polycrystalline silicon diode, and combinations of these or other diode components. Also, when referring to "a diode" herein, it is to be understood that the term may include a single diode or an arrangement of diodes in series or parallel. Similarly, when referring to "a resistive network" herein, it is to be understood that the term may include a single resistor or an arrangement of resistors in series or parallel. As will be explained in more detail later, embodiments of "diode circuits" discussed herein include at least one diode, and also may include one or more other components (e.g., one or more resistive networks or other components in series and/or parallel with the diode(s) of the diode circuit).

Figure 2:
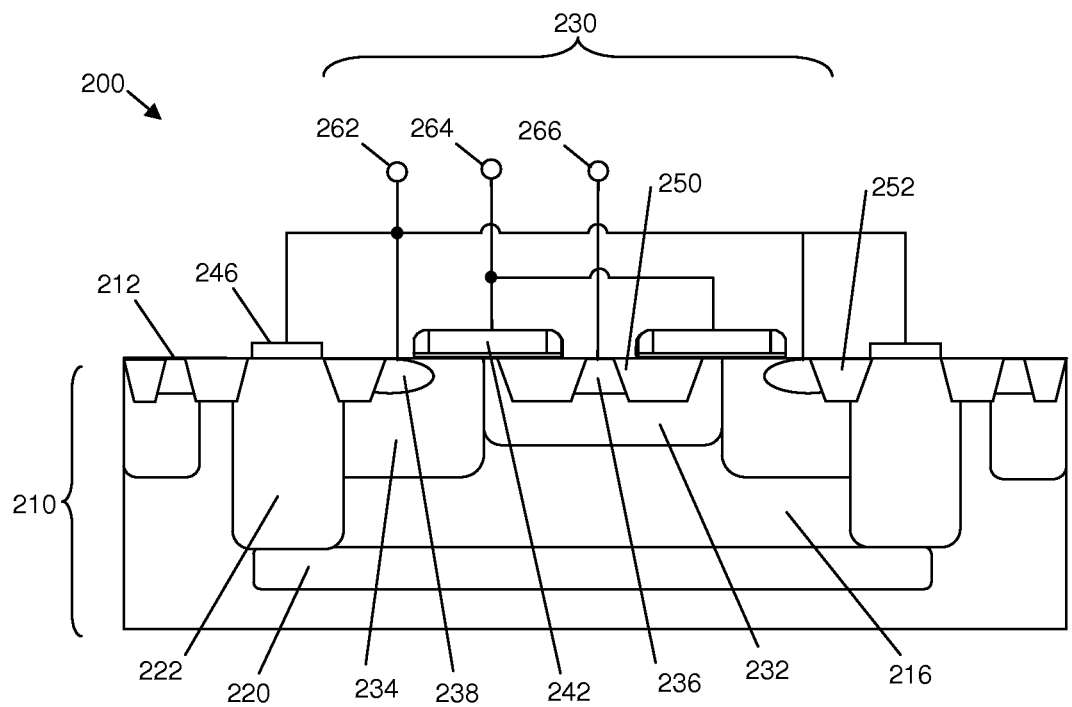
FIG. 2 is a cross-sectional view of a P-type, laterally-diffused metal oxide semiconductor field effect transistor (PLDMOSFET) with a diode circuit that includes a Schottky diode, according to an embodiment.

Embodiments of PLDMOSFETs (e.g., PLDMOSFET 116) and associated diode circuits (e.g., diode circuit 162) are described in more detail below. For example, according to an embodiment, a diode circuit 162 coupling the source region and isolation structure of PLDMOSFET 116 includes a Schottky diode. Such an embodiment is illustrated in FIG. 2, which is a cross-sectional view of a PLDMOSFET 200 (e.g., PLDMOSFET 116, FIG. 1) with a diode circuit (e.g., diode circuit 162, FIG. 1) that includes a Schottky diode, as will be explained in more detail below. According to an embodiment, various regions of PLDMOSFET 200 (and PLDMOSFETs 600, 700, 1100, 1300, FIGS. 6, 7, 11, and 13, discussed later) have ring-shaped configurations oriented in planes that are perpendicular to the cross-section illustrated in FIG. 2. Although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 236).

PLDMOSFET 200 is formed in and on a semiconductor substrate 210 (e.g., the SOC substrate discussed in conjunction with FIG. 1), which has a top substrate surface 212. According to an embodiment, PLDMOSFET 200 includes an isolation structure that substantially surrounds a portion 216 of the substrate associated with an active area 230 of the PLDMOSFET 200 (i.e., an area of the substrate 210 within which an active device is formed). In other words, the active device may be considered to be contained by the isolation structure. The isolation structure is a box-type structure, which is formed from an N-type buried layer (NBL) 220 (located at a depth below the top substrate surface 212) and an N-type sinker region 222 extending from the top substrate surface 212 to the depth of the NBL 220. The sinker region 222 may be formed using a single implantation procedure having an implant energy sufficient to enable the sinker region 222 to extend to the NBL 220, or the sinker region 222 may be formed using multiple implantation procedures having different implant energies, thus forming a series of interconnected sinker sub-regions at different depths.

PLDMOSFET 200 further includes an active device formed within the active area 230. According to an embodiment, the active device includes a P-type drift region 232, an N-type body region 234, a P-type drain region 236, a P-type source region 238, and a gate electrode 242 (and corresponding gate dielectric, not numbered). The drift region 232 is formed within a central portion of the active area 230, and extends from the top substrate surface 212 into the substrate 210 to a depth that is less than the depth of NBL 220. The drain region 236 is formed within the drift region 232, and is more heavily doped than the drift region 232. The drain region 236 extends from the top substrate surface 212 into the substrate 210 to a depth significantly less than the depth of the drift region 232. A conductive interconnect electrically couples the drain region 236 to a drain terminal 266.

The body region 234 is formed between the drift region 232 and the sinker region 222, and extends from the top substrate surface 212 into the substrate 210 to a depth that is less than the depth of NBL 220, and that may be greater than the depth of the drift region 232 (although body region 234 may extend to depths that are less than or substantially equal to the depth of the drift region 232, as well). In an embodiment, the body region 234 abuts the drift region 232. In addition, the body region 234 is merged with the sinker region 222, in an embodiment, as shown in FIG. 2. Accordingly, the isolation structure (or more specifically the sinker region 222) may be considered to be a body tie. In alternate embodiments, the body region 234 may be laterally separated from the drift region 232 and/or the sinker region 222 (e.g., as in the embodiment of FIG. 16, in which body region 1634 is separated from sinker region 1622 by P-type gap 1637), or the body region 234 may overlap the drift region 232 and/or the sinker region 222 (creating regions with dopant profiles that differ from that in the channel or drift region 232 and/or the sinker region 222). The source region 238 is formed within the body region 234, extending from the top substrate surface 212 into the substrate 210 to a depth significantly less than the depth of the body region 234. The source region 238 may be more heavily doped than the drift region 232. Gate electrode 242 is formed over a gate oxide on the top substrate surface 212 generally between the drain region 236 and the source region 238. A conductive interconnect electrically couples the gate electrode 242 to a gate terminal 264.

According to an embodiment, PLDMOSFET 200 may further include various shallow trench isolation (STI) structures 250, 252, as shown in FIG. 2. For example, at the top substrate surface 212, STI 250 abuts the drain region 236 within drift region 232, and STI 252 is positioned between the source region 238 and the isolation structure (or more specifically, sinker region 222). In alternate embodiments, either or both of STI structures 250 and/or 252 may be excluded. For example, STI 252 may be excluded, and source region 238 and sinker region 222 may be shorted together. In addition, STI 250 may be excluded, making PLDMOSFET 200 an "active drift device," rather than the "field drift device" illustrated in FIG. 2. The inclusion of STI 250 allows for a high gate-to-drain potential while reducing the risk of rupturing the gate oxide. In still other alternate embodiments, some or all of the STI structures may be replaced with a silicide blocking layer that prevents silicide formation at the surface that would otherwise short the various regions together.

According to an embodiment, PLDMOSFET 200 further includes a diode circuit (e.g., diode circuit 162, FIG. 1) connected between source region 238 and the isolation structure. More particularly, the diode circuit includes a Schottky diode formed from the metal-semiconductor junction between a Schottky contact 246 (e.g., formed with silicide on the top substrate surface 212) and the top surface of sinker region 222. In an alternate embodiment, the Schottky contact 246 may be formed on a sidewall or other surface that is not co-planar with the top substrate surface 212. According to an embodiment, a conductive interconnect electrically couples the source region 238, the Schottky contact 246, and a source terminal 262. The Schottky diode can be designed to provide a desired application-dependent breakdown voltage (e.g., a breakdown voltage greater than, less than, or equal to the normal, most negative operating voltage). For example, in an embodiment, the Schottky diode is designed to provide a reverse breakdown voltage in a range of about −0.3 volts to about −14.0 volts, although smaller or larger breakdown voltages may be achieved, as well.

As mentioned above, according to an alternate embodiment, the body region (e.g., body region 1634, FIG. 16) may be laterally separated from the sinker region (e.g., sinker region 1622, FIG. 16) so that a P-type gap is present between the body region and the sinker region (e.g., as in the embodiment of FIG. 16, discussed later). In addition, an STI structure (e.g., STI structure 1654, FIG. 16) or silicide blocking layer may be included at the substrate surface to ensure isolation between the regions. The P-type gap may be formed from a portion (e.g., portion 1637, FIG. 16) of the P-type substrate (e.g., portion 1616 of substrate 1610, FIG. 16) within the isolation structure (which would extend toward the top substrate surface between the body region and the sinker region), or from a P-type well region extending from the top substrate surface and located between the body region and the sinker region. In such embodiments, a PLDMOSFET (e.g., PLDMOSFET 1600, FIG. 16) may further include an N-type body contact region (e.g., body contact region 1635, FIG. 16) formed within the body region (e.g., between the source region and the sinker region, where the body contact region may be separated from the source region by an STI structure or silicide blocking layer). The body contact region and the source region (e.g., source region 1638, FIG. 16) may be electrically coupled (shorted) through a conductive interconnect, and the diode circuit (e.g., diode circuit 1562, FIG. 15) may be electrically coupled between the isolation structure (e.g., sinker region 1622, FIG. 16) and the shorted source and body regions. During normal operation, when the body region, source region, and isolation structure all are at high potentials, the isolation structure and body region can be effectively shorted through the lateral depletion of the P-type gap between them (e.g., which may be completely depleted before breakdown between them), or through the vertical depletion of the portion of the P-type substrate between the body region and the NBL (e.g., NBL 1620, FIG. 16), whichever comes first.

Figure 3:
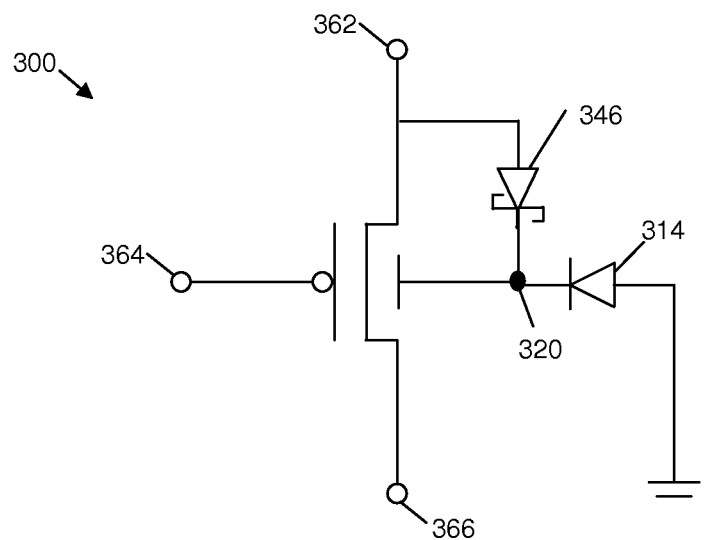
FIG. 3 is a simplified circuit representation of the PLD-MOSFET of FIG. 2, according to an embodiment.

FIG. 3 is a simplified circuit representation 300 of the PLDMOSFET 200 of FIG. 2, according to an embodiment. Referring also to FIG. 2, terminal 362 (e.g., terminal 262) is coupled with the source region (e.g., source region 238), terminal 364 (e.g., terminal 264) is coupled with the gate electrode (e.g., gate electrode 242), and terminal 366 (e.g., terminal 266) is coupled with the drain region (e.g., drain region 236).

According to an embodiment, and as discussed above, the PLDMOSFET also includes Schottky diode 346 (e.g., the interface between Schottky contact 246 and sinker region 222) electrically coupled between the source region (e.g., source region 238) and the device's isolation structure. More specifically, the anode of the Schottky diode 346 is coupled to the source region, and the cathode of the Schottky diode 346 is formed by the isolation structure (e.g., the combination of sinker region 222 and NBL 220). At node 320, diode 314 represents the diode formed by the interface between the isolation structure and the portion of the substrate outside of the isolation structure.

During normal operation in which the source potential is elevated, the Schottky diode 346 is forward biased. Accordingly, the isolation structure potential closely follows that of the source region with only a small forward voltage drop at the Schottky barrier. On the other hand, when the source potential transitions to a negative voltage, the isolation structure potential is held up by the reverse breakdown voltage of the Schottky diode 346 (e.g., between about −0.3 volts to about −14.0 volts). By holding up the potential of the isolation structure when the source potential goes negative, carrier injection into the substrate that may otherwise occur if the source and isolation structure were merely shorted may be reduced or eliminated, thus avoiding disruption of adjacent circuit blocks.

Figure 4:
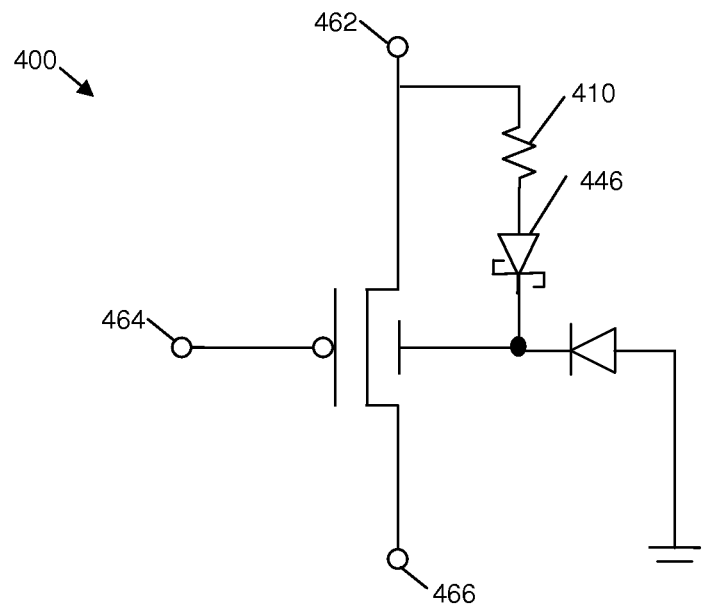
FIG. 4 is a simplified circuit representation of the PLD-MOSFET of FIG. 2 with a diode circuit that includes a resistive network in series with a Schottky diode, according to an alternate embodiment.

According to another embodiment, the diode circuit (e.g., diode circuit 162, FIG. 1) may include a resistive network in series with a Schottky diode. For example, FIG. 4 is a simplified circuit representation 400 of the PLDMOSFET 200 of FIG. 2 with a diode circuit that includes a resistive network 410 in series with a Schottky diode 446, according to an alternate embodiment. Similar to the embodiment of FIG. 3, terminal 462 (e.g., terminal 262) is coupled with the source region (e.g., source region 238), terminal 464 (e.g., terminal 264) is coupled with the gate electrode (e.g., gate electrode 242), and terminal 466 (e.g., terminal 266) is coupled with the drain region (e.g., drain region 236).

Schottky diode 446 (e.g., the interface between Schottky contact 246 and sinker region 222) and resistive network 410 are electrically coupled in series between the source region (e.g., source region 238) and the device's isolation structure. For example, resistive network 410 may be formed from polycrystalline silicon, and may be located on an insulated region of the top surface of the substrate (e.g., on STI 252). Alternatively, resistive network 410 may be formed from other materials and/or located elsewhere. During operation, when the source potential transitions to a negative voltage, the isolation structure potential is held up by the voltage drop across resistive network 410 in series with the reverse breakdown voltage of the Schottky diode 446 (e.g., between about −0.3 volts to about −14.0 volts). The combination of the Schottky diode 446 and resistive network 410 may allow for more flexibility in the construction of the Schottky diode 446. In addition, in choosing a value for resistive network 410 to achieve optimum overall results in maintaining the PLDMOSFET's integrity, electrostatic discharge (ESD) robustness may be achieved while reducing substrate injection. More specifically, for example, under conditions in which the Schottky diode 446 is run into breakdown (e.g., during ESD stress), the current through the Schottky diode 446 is limited by resistive network 410 to the extent of its capability, thus reducing the likelihood that an ESD event may damage Schottky diode 446.

Figure 5:
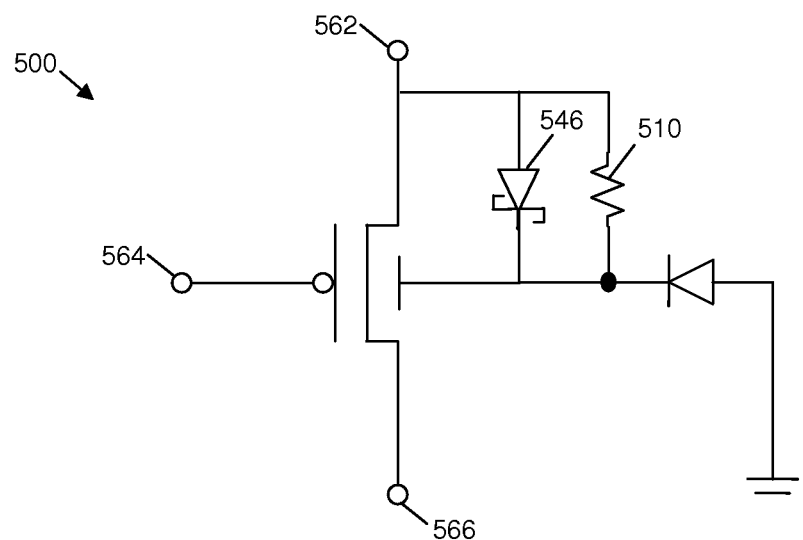
FIG. 5 is a simplified circuit representation of the PLD-MOSFET of FIG. 2 with a diode circuit that includes a resistive network in parallel with a Schottky diode, according to another alternate embodiment.

According to yet another embodiment, the diode circuit (e.g., diode circuit 162, FIG. 1) may include a resistive network in parallel with a Schottky diode. For example, FIG. 5 is a simplified circuit representation 500 of the PLDMOSFET 200 of FIG. 2 with a diode circuit that includes a resistive network 510 in parallel with a Schottky diode 546, according to an alternate embodiment. Similar to the embodiment of FIG. 2, terminal 562 (e.g., terminal 262) is coupled with the source region (e.g., source region 238), terminal 564 (e.g., terminal 264) is coupled with the gate electrode (e.g., gate electrode 242), and terminal 566 (e.g., terminal 266) is coupled with the drain region (e.g., drain region 236).

Schottky diode 546 (e.g., the interface between Schottky contact 246 and sinker region 222) and resistive network 510 are electrically coupled in parallel between the source region (e.g., source region 238) and the device's isolation structure. For example, resistive network 510 may be formed from polycrystalline silicon, and may be located on an insulated region of the top surface of the substrate (e.g., on STI 252). Alternatively, resistive network 510 may be formed from other materials and/or located elsewhere. During operation, when the source potential transitions to a negative voltage, the isolation structure potential is held up by the voltage drop across resistive network 510 in parallel with the reverse breakdown voltage of the Schottky diode 546 (e.g., between about −0.3 volts to about −14.0 volts). As with the diode circuit discussed in conjunction with FIG. 4, the combination of the Schottky diode 546 and resistive network 510 may allow for more flexibility in the construction of the Schottky diode 546. In addition, resistive network 510 may function to maintain the potential of the isolation structure closer to the source potential of the PLDMOSFET, under certain circumstances. For example, when the source potential is falling (although still positive), the potential of the isolation structure is pulled down only by the capacitance of Schottky diode 546, which may or may not be sufficient. In such a case, resistive network 510 may help to discharge the potential of the isolation structure towards the source potential. Although some minority carrier injection may be added when the source potential transitions negative, resistive network 510 may limit the amount of carrier injection.

In the embodiments discussed in conjunction with FIGS. 4 and 5, a diode circuit (e.g., diode circuit 162, FIG. 1) includes a Schottky diode (e.g., Schottky diodes 446, 546) and either a resistive network coupled in series (resistive network 410) or a resistive network coupled in parallel (resistive network 510) with the Schottky diode. In another alternate embodiment, a diode circuit may include a Schottky diode and both a first resistive network coupled in series and a second resistive network coupled in parallel with the Schottky diode, in order to realize the advantages that may be provided by both the series-coupled and parallel-coupled resistive network arrangements.

Figure 6:
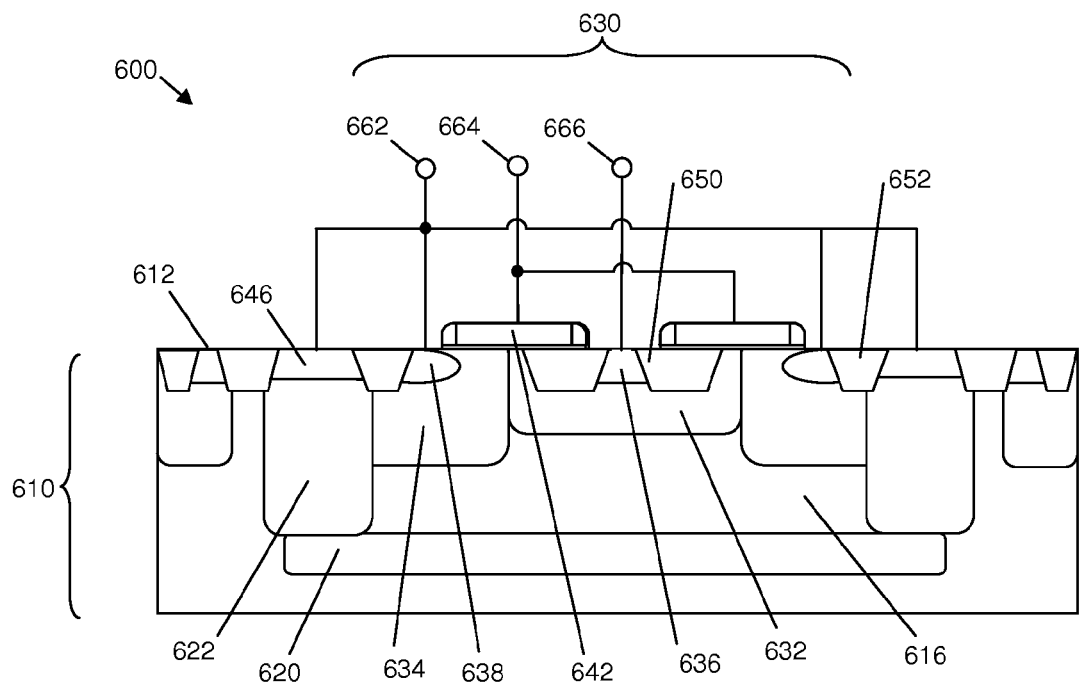
FIG. 6 is a cross-sectional view of a PLDMOSFET with a diode circuit that includes a PN junction diode, according to an alternate embodiment.
Figure 7:
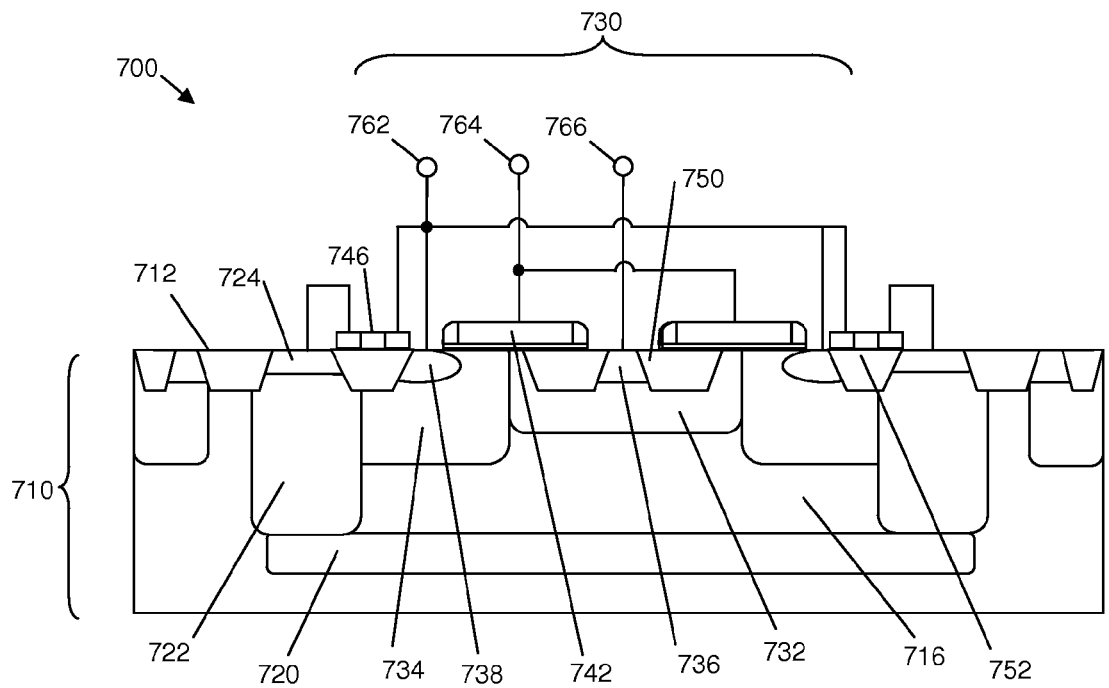
FIG. 7 is a cross-sectional view of a PLDMOSFET with a diode circuit that includes a polycrystalline silicon diode, according to another alternate embodiment.

In the embodiments discussed in conjunction with FIGS. 2-5, a diode circuit (e.g., diode circuit 162, FIG. 1) coupling the source region and isolation structure of an embodiment of a PLDMOSFET (e.g., PLDMOSFET 116, FIG. 1) includes a Schottky diode. According to other embodiments, a diode circuit coupling the source region and isolation structure of an embodiment of a PLDMOSFET instead includes a PN junction diode (e.g., including either a PN junction (FIG. 6) or a polycrystalline silicon diode (FIG. 7)). For example, FIGS. 6 and 7 are cross-sectional views of PLDMOSFETs 600, 700 (e.g., PLDMOSFET 116, FIG. 1), each with a diode circuit (e.g., diode circuit 162, FIG. 1) that includes a PN junction diode. Much of the structure of the PLDMOSFETs 600, 700 (FIGS. 6, 7) is similar to the structure of PLDMOSFET 200 discussed in detail in conjunction with FIG. 2. For brevity, the similar structural elements are not discussed in detail below, but the discussion in conjunction with FIG. 2 is intended to apply equally to FIGS. 6 and 7. In addition, common elements of FIGS. 6 and 7 are discussed together, below, and the differences between the devices are specified thereafter.

PLDMOSFETs 600, 700 are formed in and on a P-type semiconductor substrate 610, 710 (e.g., the SOC substrate discussed in conjunction with FIG. 1), which has a top substrate surface 612, 712. Each PLDMOSFET 600, 700 includes an isolation structure that substantially surrounds a portion 616, 716 of the substrate 610, 710 corresponding to an active area 630, 730 of the PLDMOSFET 600, 700. The isolation structure is formed from NBL 620, 720 (located at a depth below the top substrate surface 612, 712) and an N-type sinker region 622, 722 extending from the top substrate surface 612, 712 to the depth of the NBL 620, 720. PLDMOSFET 600, 700 further includes an active device formed within the active area 630, 730. According to an embodiment, the active device includes an P-type drift region 632, 732, an N-type body region 634, 734, a P-type drain region 636, 736, a P-type source region 638, 738, and a gate electrode 642, 742. In an embodiment, the body region 634, 734 abuts the drift region 632, 732. In addition, the body region 634, 734 is merged with the sinker region 622, 722, in an embodiment, as shown in FIGS. 6 and 7. Accordingly, the isolation structure (or more specifically the sinker region 622, 722) may be considered to be a body tie. In alternate embodiments, the body region 634, 734 may be laterally separated from the drift region 632, 732 and/or the sinker region 622, 722 (e.g., as in the embodiments of FIGS. 20 and 21, in which body regions 2034, 2134 are separated from sinker regions 2022, 2122 by P-type gaps 2037, 2137), or the body region 634, 734 may overlap the drift region 632, 732 and/or the sinker region 622, 722 (creating regions with dopant profiles that differ from that in the channel or drift region 632, 732 and/or the sinker region 622, 722). A conductive interconnect electrically couples the drain region 636, 736 to a drain terminal 666, 766. Similarly, a conductive interconnect electrically couples the gate electrode 642, 742 to a gate terminal 664, 764. PLDMOSFET 600, 700 may further include STI structures 650, 750, 652, and 752. In alternate embodiments, some or all of STI structures 650, 750, 652, and/or 752 may be excluded. In still other alternate embodiments, some or all of the STI structures may be replaced with a silicide blocking layer.

According to an embodiment, PLDMOSFET 600 (FIG. 6) further includes a diode circuit (e.g., diode circuit 162, FIG. 1) that includes a PN junction diode connected between source region 638 and the isolation structure. More particularly, PLDMOSFET 600 further includes a P-type region 646 extending into sinker region 622, where P-type region 646 may be more heavily doped than P-type drift region 632. The PN junction between P-type region 646 and sinker region 622 forms the PN junction diode of the diode circuit. According to an embodiment, a conductive interconnect electrically couples the source region 638, the P-type region 646, and a source terminal 662. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to another embodiment, PLDMOSFET 700 (FIG. 7) further includes a diode circuit (e.g., diode circuit 162, FIG. 1) that includes a polycrystalline silicon diode 746, which is connected between source region 738 and an N-type region 724 extending into the sinker region 722, where N-type region 724 is more heavily doped than sinker region 722 to provide for Ohmic contact to sinker region 722. For example, polycrystalline silicon diode 746 may be formed from a P-type region and an N-type region separated by a neutral spacer region that defines the breakdown voltage of polycrystalline silicon diode 746. Polysilicon diode 746 may be formed on an insulated region of the top surface of the substrate (e.g., on STI 752, as shown). Alternatively, diode 746 may be formed from other materials and/or located elsewhere. In an embodiment, the polycrystalline silicon diode 746 may be designed to provide a desired application-dependent reverse breakdown voltage greater than, less than, or equal to the normal, most negative operating voltage (e.g., a breakdown voltage in a range of about −0.3 volts to about −14.0 volts, although smaller or larger breakdown voltages may be achieved, as well). According to an embodiment, a conductive interconnect electrically couples the source region 738, the anode of polycrystalline silicon diode 746, and a source terminal 762. An additional conductive interconnect electrically couples the cathode of polycrystalline silicon diode 746 to sinker region 722 at the top substrate surface 712.

Figure 8:
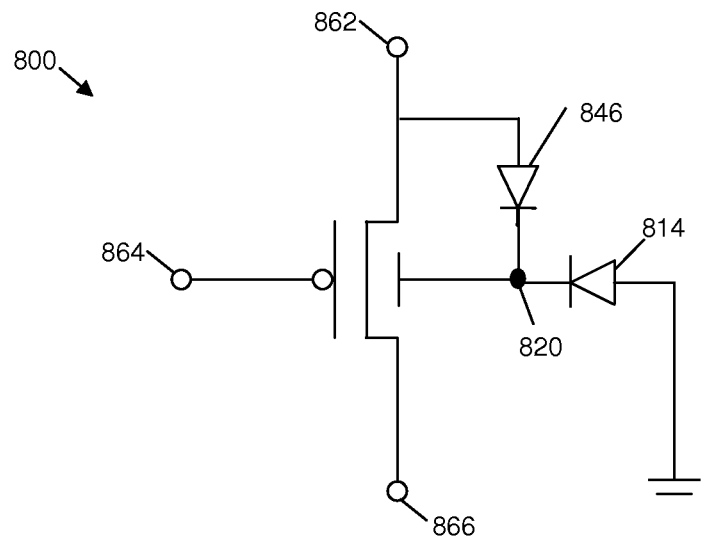
FIG. 8 is a simplified circuit representation of the PLD-MOSFETs of FIGS. 6 and 7, according to an embodiment.

FIG. 8 is a simplified circuit representation 800 of the PLDMOSFET 600, 700 of FIGS. 6 and 7, according to an embodiment. Referring also to FIGS. 6 and 7, terminal 862 (e.g., terminal 662, 762) is coupled with the source region (e.g., source region 638, 738), terminal 864 (e.g., terminal 664, 764) is coupled with the gate electrode (e.g., gate electrode 642, 742), and terminal 866 (e.g., terminal 666, 766) is coupled with the drain region (e.g., drain region 636, 736).

According to an embodiment, and as discussed above, the PLDMOSFET also includes PN junction diode 846 (e.g., the PN junction diode formed between P+ region 646 and sinker region 622, or polycrystalline silicon diode 746) electrically coupled between the source region (e.g., source region 638, 738) and the device's isolation structure. More specifically, the anode of the PN junction diode 846 is coupled to the source region, and the cathode of the PN junction diode 846 is formed by the isolation structure (e.g., the combination of sinker region 622, 722 and NBL 620, 720). At node 820, diode 814 represents the diode formed by the interface between the isolation structure and the portion of the substrate outside of the isolation structure.

During normal operation in which the source potential is elevated, the PN junction diode 846 is forward biased. Accordingly, the isolation structure potential closely follows that of the source region with a relatively small forward voltage drop at the PN junction. On the other hand, when the source potential transitions to a negative voltage, the isolation structure potential is held up by the reverse breakdown voltage of the PN junction diode 846 (e.g., between about −0.3 volts to about −14.0 volts or more). As with the embodiment previously discussed in conjunction with FIG. 2, by holding up the potential of the isolation structure when the source potential goes negative, carrier injection into the substrate that may otherwise occur if the source and isolation structure were merely shorted may be reduced or eliminated, thus avoiding disruption of adjacent circuit blocks.

Figure 9:
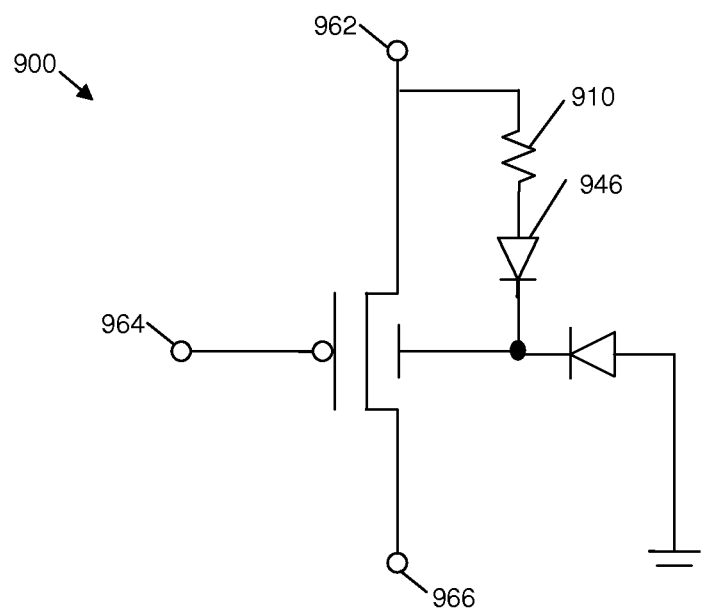
FIG. 9 is a simplified circuit representation of the PLD-MOSFETs of FIGS. 6, 7 with a diode circuit that includes a resistive network in series with a PN junction diode, according to an alternate embodiment.

According to another embodiment, the diode circuit (e.g., diode circuit 162, FIG. 1) may include a resistive network in series with a PN junction diode. For example, FIG. 9 is a simplified circuit representation 900 of the PLDMOSFETs 600, 700 of FIGS. 6, 7 with a diode circuit that includes a resistive network 910 in series with a PN junction diode 946, according to an alternate embodiment. Similar to the embodiment of FIG. 8, terminal 962 (e.g., terminal 662, 762) is coupled with the source region (e.g., source region 638, 738), terminal 964 (e.g., terminal 664, 764) is coupled with the gate electrode (e.g., gate electrode 642, 742), and terminal 966 (e.g., terminal 666, 766) is coupled with the drain region (e.g., drain region 636, 736).

PN junction diode 946 (e.g., the PN junction diode formed between P+ region 646 and sinker region 622, or polycrystalline silicon diode 746) and resistive network 910 are electrically coupled in series between the source region (e.g., source region 638, 738) and the device's isolation structure. For example, resistive network 910 may be formed from polycrystalline silicon, and may be located on an insulated region of the top surface of the substrate (e.g., on STI 652, 752). Alternatively, resistive network 910 may be formed from other materials and/or located elsewhere. During operation, when the source potential transitions to a negative voltage, the isolation structure potential is held up by the voltage drop across resistive network 910 in series with the reverse breakdown voltage of the PN junction diode 946 (e.g., between about −0.3 volts to about −14.0 volts or more). As with the embodiment previously discussed in conjunction with FIG. 4, the combination of the PN junction diode 946 and resistive network 910 may provide certain advantageous effects.

Figure 10:
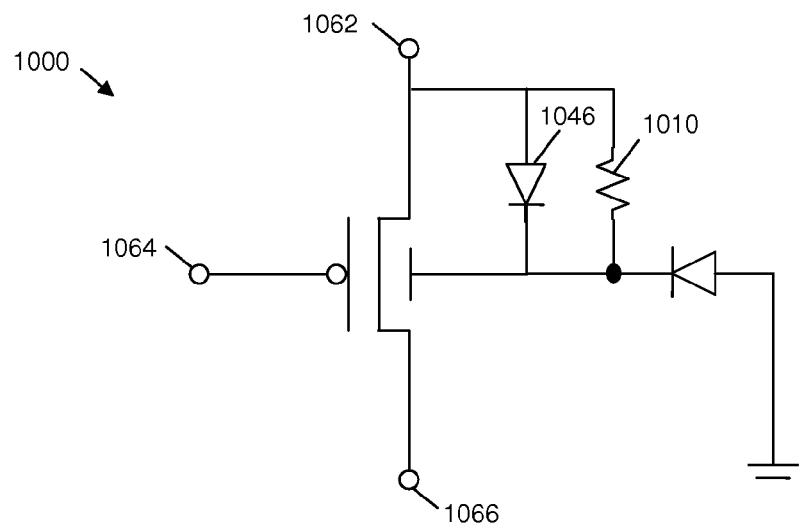
FIG. 10 is a simplified circuit representation of the PLD-MOSFETs of FIGS. 6, 7 with a diode circuit that includes a resistive network in parallel with a PN junction diode, according to another alternate embodiment.

According to yet another embodiment, the diode circuit (e.g., diode circuit 162, FIG. 1) may include a resistive network in parallel with a PN junction diode. For example, FIG. 10 is a simplified circuit representation 1000 of the PLDMOSFETs 600, 700 of FIGS. 6, 7 with a diode circuit that includes a resistive network 1010 in parallel with a PN junction diode 1046, according to an alternate embodiment. Similar to the embodiment of FIG. 8, terminal 1062 (e.g., terminal 662, 762) is coupled with the source region (e.g., source region 638, 738), terminal 1064 (e.g., terminal 664, 764) is coupled with the gate electrode (e.g., gate electrode 642, 742), and terminal 1066 (e.g., terminal 666, 766) is coupled with the drain region (e.g., drain region 636, 736).

PN junction diode 1046 (e.g., the PN junction diode formed between P+ region 646 and sinker region 622, or polycrystalline silicon diode 746) and resistive network 1010 are electrically coupled in parallel between the source region (e.g., source region 638, 738) and the device's isolation structure. For example, resistive network 1010 may be formed from polycrystalline silicon, and may be located on an insulated region of the top surface of the substrate (e.g., on STI 652, 752). Alternatively, resistive network 1010 may be formed from other materials and/or located elsewhere. During operation, when the source potential transitions to a negative voltage, the isolation structure potential is held up by the voltage drop across resistive network 1010 in parallel with the reverse breakdown voltage of the PN junction diode 1046 (e.g., between about −0.3 volts to about −14.0 volts or more). As with the diode circuit discussed in conjunction with FIG. 5, the combination of the PN junction diode 1046 and resistive network 1010 may have certain advantageous effects.

In the embodiments discussed in conjunction with FIGS. 9 and 10, a diode circuit (e.g., diode circuit 162, FIG. 1) includes a PN junction diode (e.g., PN junction diodes 946, 1046) and either a resistive network coupled in series (resistive network 910) or a resistive network coupled in parallel (resistive network 1010) with the PN junction diode. In another alternate embodiment, a diode circuit may include a PN junction diode and both a first resistive network coupled in series and a second resistive network coupled in parallel with the PN junction diode, in order to realize the advantages that may be provided by both the series-coupled and parallel-coupled resistive network arrangements.

Figure 11:
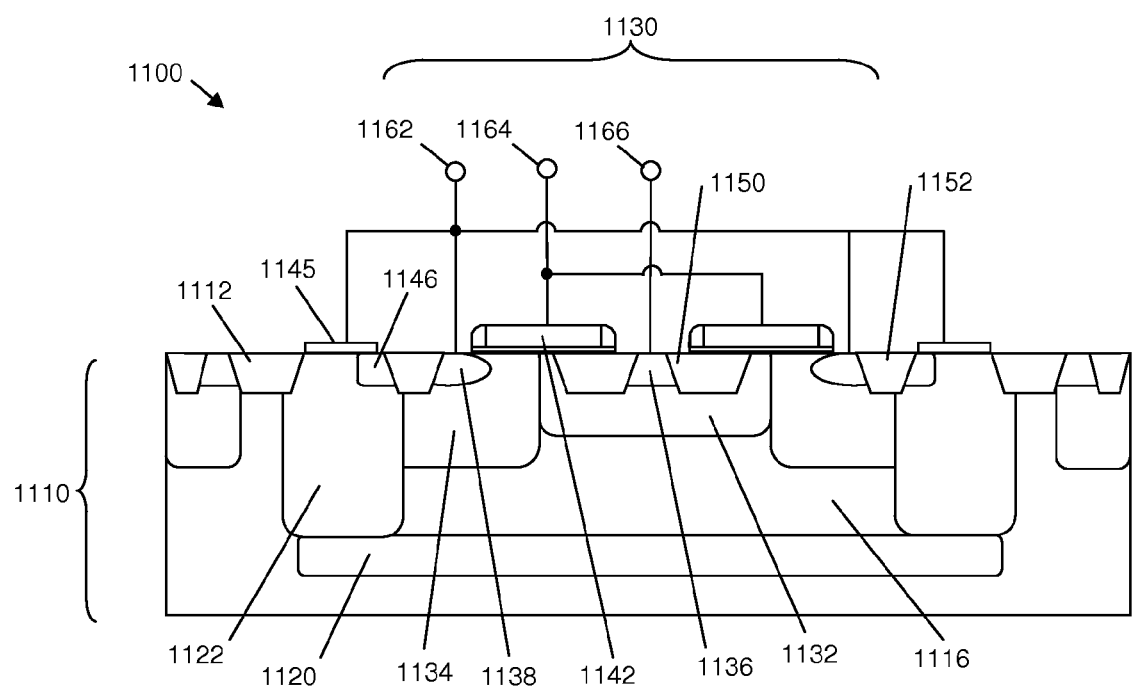
FIG. 11 is a cross-sectional view of a PLDMOSFET with a diode circuit that includes a combination of one or more Schottky diodes and one or more PN junction diodes, according to an embodiment.
Figure 13:
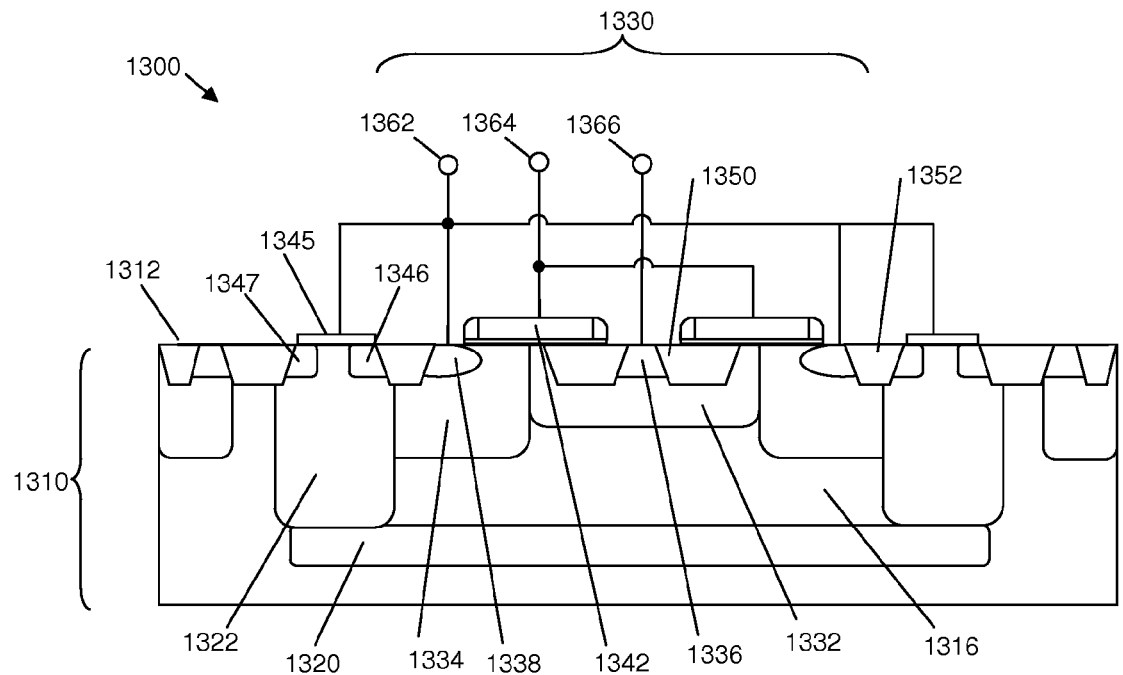
FIG. 13 is a cross-sectional view of a PLDMOSFET with a diode circuit that includes a combination of one or more Schottky diodes and one or more PN junction diodes, according to an alternate embodiment.

In the embodiments discussed in conjunction with FIGS. 2-10, a diode circuit (e.g., diode circuit 162, FIG. 1) coupling the source region and isolation structure of an embodiment of a PLDMOSFET (e.g., PLDMOSFET 116, FIG. 1) includes either a Schottky diode or a PN junction diode. According to other embodiments, a diode circuit coupling the source region and isolation structure of an embodiment of a PLDMOSFET instead includes a combination of one or more Schottky diodes and one or more PN junction diodes. For example, FIGS. 11 and 13 are cross-sectional views of PLDMOSFETs 1100, 1300 (e.g., PLDMOSFET 116, FIG. 1), each with a diode circuit (e.g., diode circuit 162, FIG. 1) that includes a combination of one or more Schottky diodes and one or more PN junction diodes. Again, much of the structure of the PLDMOSFETs 1100, 1300 (FIGS. 11, 13) is similar to the structure of PLDMOSFET 200 discussed in detail in conjunction with FIG. 2. For brevity, the similar structural elements are not discussed in detail below, but the discussion in conjunction with FIG. 2 is intended to apply equally to FIGS. 11 and 13. In addition, common elements of FIGS. 11 and 13 are discussed together, below, and the differences between the devices are specified thereafter.

PLDMOSFETs 1100, 1300 are formed in and on a P-type semiconductor substrate 1110, 1310 (e.g., the SOC substrate discussed in conjunction with FIG. 1), which has a top substrate surface 1112, 1312. Each PLDMOSFET 1100, 1300 includes an isolation structure that substantially surrounds a portion 1116, 1316 of the substrate 1110, 1310 associated with an active area 1130, 1330 of the PLDMOSFET 1100, 1300. The isolation structure is formed from NBL 1120, 1320 (located at a depth below the top substrate surface 1112, 1312), and an N-type sinker region 1122, 1322 extending from the top substrate surface 1112, 1312 to the depth of the NBL 1120, 1320. PLDMOSFET 1100, 1300 further includes an active device formed within the active area 1130, 1330. According to an embodiment, the active device includes a P-type drift region 1132, 1332, an N-type body region 1134, 1334, a P-type drain region 1136, 1336, a P-type source region 1138, 1338, and a gate electrode 1142, 1342. In an embodiment, the body region 1134, 1334 abuts the drift region 1132, 1332. In addition, the body region 1134, 1334 is merged with the sinker region 1122, 1322, in an embodiment, as shown in FIGS. 11 and 13. Accordingly, the isolation structure (or more specifically the sinker region 1122, 1322) may be considered to be a body tie. In alternate embodiments, the body region 1134, 1334 may be laterally separated from the drift region 1132, 1332 and/or the sinker region 1122, 1322 (e.g., as in the embodiments of FIGS. 25 and 27, in which body regions 2534, 2734 are separated from sinker regions 2522, 2722 by P-type gaps 2537, 2737), or the body region 1134, 1334 may overlap the drift region 1132, 1332 and/or the sinker region 1122, 1322 (creating regions with dopant profiles that differ from that in the channel or drift region 1132, 1332 and/or the sinker region 1122, 1322). A conductive interconnect electrically couples the drain region 1136, 1336 to a drain terminal 1166, 1366. Similarly, a conductive interconnect electrically couples the gate electrode 1142, 1342 to a gate terminal 1164, 1364. PLDMOSFET 1100, 1300 may further include STI structures 1150, 1350, 1152, and 1352. In alternate embodiments, some or all of STI structures 1150, 1350, 1152, and/or 1352 may be excluded. In still other alternate embodiments, some or all of the STI structures may be replaced with a silicide blocking layer.

According to an embodiment, PLDMOSFET 1100 (FIG. 11) further includes a diode circuit (e.g., diode circuit 162, FIG. 1) that includes a combination of a Schottky diode and a PN junction diode connected in parallel between source region 1138 and the isolation structure. More particularly, the diode circuit includes a Schottky diode formed from the metal-semiconductor junction between a Schottky contact 1145 (e.g., formed with silicide on the top substrate surface 1112) and the top surface of sinker region 1122. In addition, PLDMOSFET 1100 further includes a P-type region 1146 extending into sinker region 1122 and partially across the sinker region 1122. The PN junction between P-type region 1146 and sinker region 1122 forms the PN junction diode of the diode circuit. At the substrate surface 1112, the Schottky contact 1145 contacts both the top surface of the P-type region 1146 and a portion of the top surface of the sinker region 1122. According to an embodiment, placing the PN diode alongside the Schottky diode allows the PN junction to deplete the silicon under the Schottky diode, thus reducing reverse-biased leakage in the Schottky diode.

According to an embodiment, a conductive interconnect electrically couples the source region 1138, the Schottky contact 1145, the P-type region 1146, and a source terminal 1162. The Schottky diode and the PN junction diode can be designed to provide a desired application-dependent breakdown voltage (e.g., a breakdown voltage greater than, less than, or equal to the normal, most negative operating voltage). For example, in an embodiment, the Schottky diode and the PN junction diode each may be designed to provide a reverse breakdown voltage in a range of about −0.3 volts to about −14.0 volts, although smaller or larger breakdown voltages may be achieved, as well.

Figure 12:
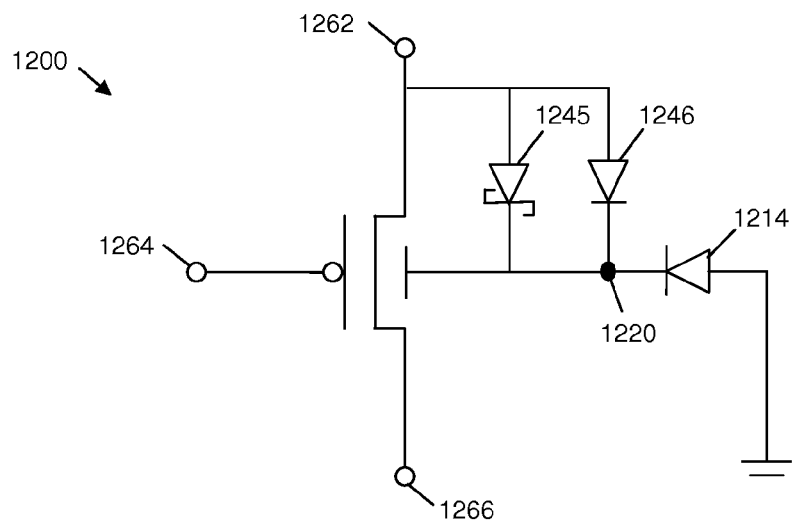
FIG. 12 is a simplified circuit representation of the PLD-MOSFET of FIG. 11, according to an embodiment.

FIG. 12 is a simplified circuit representation 1200 of the PLDMOSFET 1100 of FIG. 11, according to an embodiment. Referring also to FIG. 11, terminal 1262 (e.g., terminal 1162) is coupled with the source region (e.g., source region 1138), terminal 1264 (e.g., terminal 1164) is coupled with the gate electrode (e.g., gate electrode 1142), and terminal 1266 (e.g., terminal 1166) is coupled with the drain region (e.g., drain region 1136).

According to an embodiment, and as discussed above, the PLDMOSFET also includes Schottky diode 1245 (e.g., the interface between Schottky contact 1145 and sinker region 1122) in parallel with PN junction diode 1246 (e.g., the PN junction diode formed between P+ region 1146 and sinker region 1122), which are electrically coupled between the source region (e.g., source region 1138) and the device's isolation structure. According to an embodiment, and as illustrated in FIG. 11, the PN junction diode 1246 consists of the interface between P+ region 1146 and sinker region 1122. The anodes of the Schottky diode 1245 and the PN junction diode 1246 are coupled to the source region, and the cathodes of the Schottky diode 1245 and the PN junction diode 1246 are formed by the isolation structure (e.g., the combination of sinker region 1122 and NBL 1120). In other alternate embodiments, the diode circuit may include one or more resistive networks coupled in series and/or in parallel with the combination of the Schottky diode 1245 and the PN junction diode 1246, as previously discussed in conjunction with FIGS. 4, 5, 9, and 10. At node 1220, diode 1214 represents the diode formed by the interface between the isolation structure and the portion of the substrate outside of the isolation structure.

According to another embodiment, PLDMOSFET 1300 (FIG. 13) includes a diode circuit (e.g., diode circuit 162, FIG. 1) that includes a combination of a Schottky diode and a "split" PN junction diode connected in parallel between source region 1338 and the isolation structure. More particularly, the diode circuit includes a Schottky diode formed from the metal-semiconductor junction between a Schottky contact 1345 (e.g., formed with silicide on the top substrate surface 1312) and the top surface of sinker region 1322. In addition, PLDMOSFET 1300 further includes a first P-type region 1346 extending into sinker region 1322 and partially across the sinker region 1322 at an interior wall of the sinker region 1322 (i.e., the wall closest to the active region 1330), and a second P-type region 1347 extending into sinker region 1322 and partially across the sinker region 1322 at an exterior wall of the sinker region 1322 (i.e., the wall farthest from the active region 1330). A portion of the sinker region 1322 is present at the top substrate surface 1312 between the first and second P-type regions 1346, 1347, and Schottky contact 1345 contacts at least that portion of the sinker region 1322.

The PN junctions between P-type regions 1346, 1347 and sinker region 1322 form the PN junction diodes of the diode circuit. At the substrate surface 1312, the Schottky contact 1345 contacts both the top surface of the first and second P-type regions 1346, 1347 and a portion of the top surface of the sinker region 1322. By placing multiple P-type regions 1346, 1347 close together and interleaved with the Schottky barrier, the P-type regions 1346, 1347 may help to deplete the Schottky barrier area under reverse bias to limit the leakage current.

According to an embodiment, a conductive interconnect electrically couples the source region 1338, the Schottky contact 1345, the P-type regions 1346, 1347, and a source terminal 1362. The Schottky diode and the PN junction diodes can be designed to provide a desired application-dependent breakdown voltage (e.g., a breakdown voltage greater than, less than, or equal to the normal, most negative operating voltage). For example, in an embodiment, the Schottky diodes and the PN junction diodes each may be designed to provide a reverse breakdown voltage in a range of about −0.3 volts to about −14.0 volts, although smaller or larger breakdown voltages may be achieved, as well.

Figure 14:
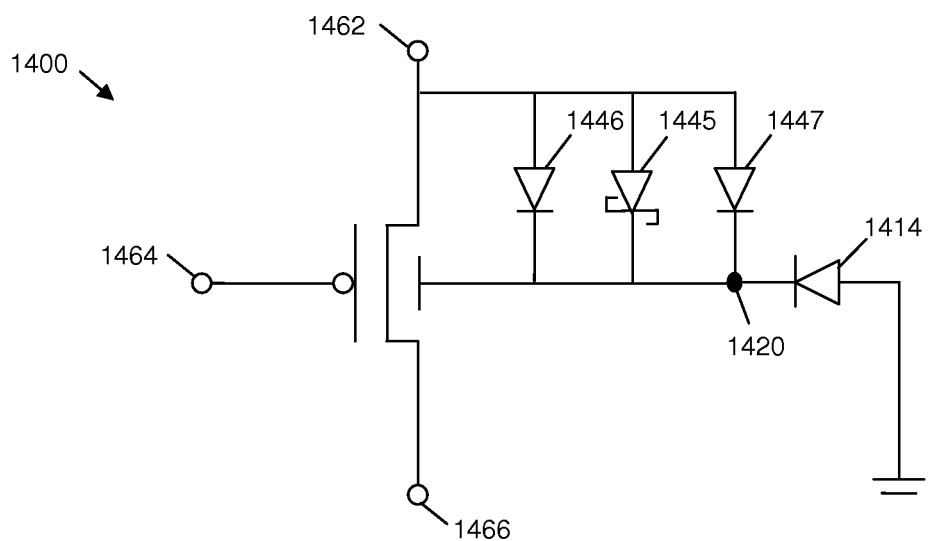
FIG. 14 is a simplified circuit representation of the PLD-MOSFET of FIG. 13, according to an embodiment.

FIG. 14 is a simplified circuit representation 1400 of the PLDMOSFET 1300 of FIG. 13, according to an embodiment. Referring also to FIG. 13, terminal 1462 (e.g., terminal 1362) is coupled with the source region (e.g., source region 1338), terminal 1464 (e.g., terminal 1364) is coupled with the gate electrode (e.g., gate electrode 1342), and terminal 1466 (e.g., terminal 1366) is coupled with the drain region (e.g., drain region 1336).

According to an embodiment, and as discussed above, the PLDMOSFET also includes Schottky diode 1445 (e.g., the interface between Schottky contact 1345 and sinker region 1322) in parallel with first and second PN junction diodes 1446, 1447 (e.g., the PN junction diodes formed between P+ regions 1346, 1347 and sinker region 1322), which are electrically coupled between the source region (e.g., source region 1338) and the device's isolation structure. According to an embodiment, and as illustrated in FIG. 13, the PN junction diodes 1446, 1447 consist of the interface between P+ regions 1346, 1347 and sinker region 1322. The anodes of the Schottky diode 1445 and the PN junction diodes 1446, 1447 are coupled to the source region, and the cathodes of the Schottky diode 1445 and the PN junction diodes 1446, 1447 are formed by the isolation structure (e.g., the combination of sinker region 1322 and NBL 1320). In other alternate embodiments, the diode circuit may include one or more resistive networks coupled in series and/or in parallel with the combination of the Schottky diode 1445 and the PN junction diodes 1446, 1447, as previously discussed in conjunction with FIGS. 4, 5, 9, and 10. At node 1420, diode 1414 represents the diode formed by the interface between the isolation structure and the remainder of the substrate outside of the isolation structure.

Referring to both FIGS. 12 and 14, during normal operation in which the source potential is elevated, the Schottky diode 1245, 1445 and PN junction diode(s) 1246, 1446, 1447 are forward biased, and the Schottky diode 1245, 1445 clamps the forward bias of the PN junction diode(s) 1246, 1446, 1447. Accordingly, the isolation structure potential closely follows that of the source region with a relatively small forward voltage drop associated with the Schottky diode 1245, 1445 and the PN junction diode(s) 1246, 1446, 1447. On the other hand, when the source potential transitions to a negative voltage, the isolation structure potential is held up by the reverse breakdown voltage of the Schottky diode 1245, 1445 and/or the PN junction diode(s) 1246, 1446, 1447 (e.g., between about −0.3 volts to about −14.0 volts or more). As with the embodiment previously discussed in conjunction with FIG. 2, by holding up the potential of the isolation structure when the source potential goes negative, carrier injection into the substrate that may otherwise occur if the source and isolation structure were merely shorted may be reduced or eliminated, thus avoiding disruption of adjacent circuit blocks.

In the above-described embodiments, the body region (e.g., body region 234, FIG. 2) and the isolation structure are merged, and the isolation structure (or more specifically the sinker region (e.g., sinker region 222, FIG. 2)) can be considered to be a body tie. In such embodiments, when a diode circuit (e.g., diode circuit 162, FIG. 1) is coupled to the source terminal, a body bias may be created during operation, as the source region-to-body region junction may become forward biased. In alternate embodiments, which will be described in more detail in conjunction with FIGS. 15-28, the body region and the isolation structure may be separated by a region of P-type material (e.g., a portion of the substrate associated with the active area or a P-type well), and a distinct body terminal may be provided to facilitate electrical access to the body region. In such embodiments, a diode circuit similar to the above-described diode circuits may be coupled between the body region and the isolation structure, rather than coupling the diode circuit between the source region and the isolation structure, as in the above-described embodiments. In embodiments in which the body region and the isolation structure are separated, the body region and the source region may be tied together (e.g., they may have the same bias during normal operation), and the potential of the isolation structure may be held up by the diode circuit when a negative potential appears at the source/body terminal. During normal operation, when the body region, source region, and isolation structure are all at high potentials, the isolation region and the body region can effectively be shorted through the complete depletion of the P-type material between the body region and the isolation structure.

Figure 15:
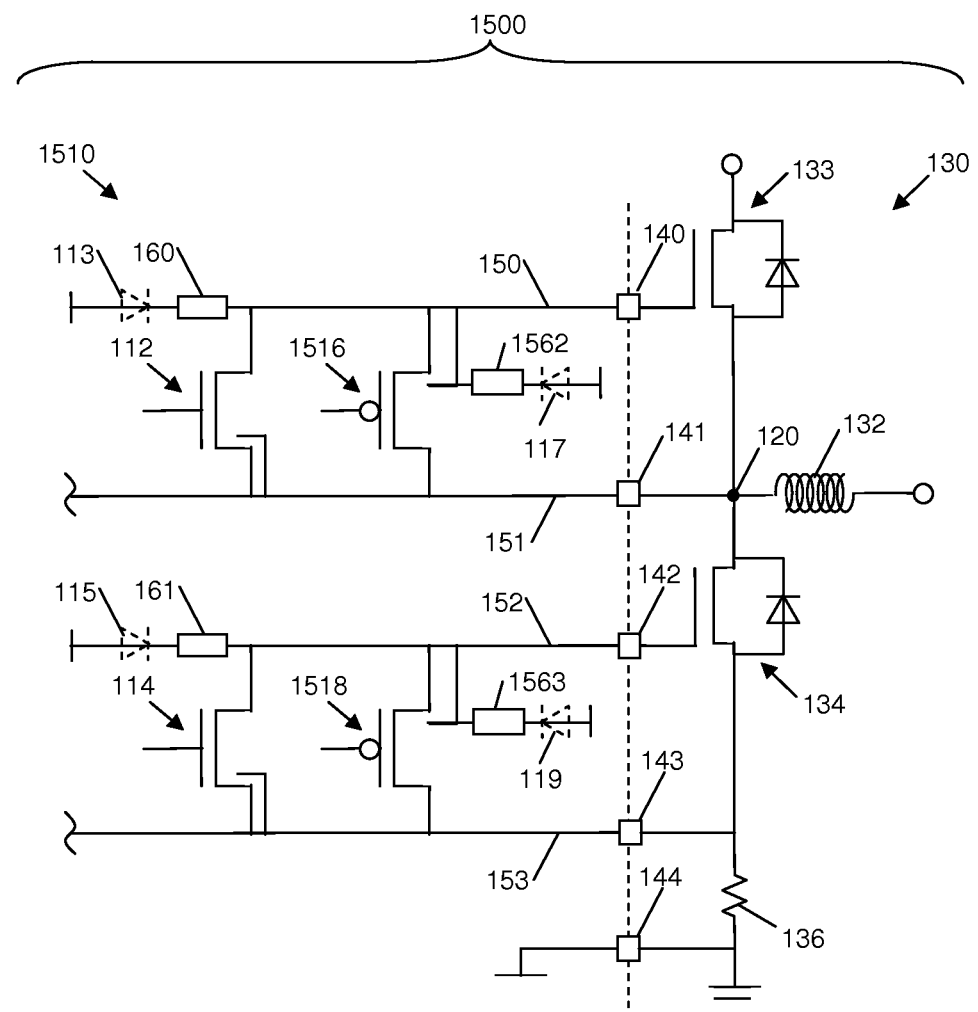
FIG. 15 is a simplified diagram of an electronic system that includes a driver circuit configured to drive an external circuit that includes an inductive load, according to an embodiment.

For example, FIG. 15 is a simplified diagram of an electronic system 1500 that includes a driver circuit 1510, in accordance with another embodiment. Substantial portions of system 1500 are similar to system 100 depicted in FIG. 1, and like reference numbers between FIG. 1 and FIG. 15 represent analogous system elements. In the interest of brevity, those like system elements are not discussed in detail here, although their descriptions, above, apply equally to the system of FIG. 15.

System 1500 differs from system 100, in that driver circuit 1510 includes a diode circuit 1562 coupled between the body region and the isolation structure of PLDMOSFET 1516 (rather than diode circuit 162 coupled between the source region and the isolation structure, as for PLDMOSFET 116, FIG. 1). In addition, driver circuit 1510 includes a diode circuit 1563 coupled between the body region and the isolation structure of PLDMOSFET 1518 (rather than diode circuit 163 coupled between the source region and the isolation structure, as for PLDMOSFET 118, FIG. 1). Diode circuits 1562, 1563 are configured to reduce or eliminate current injection into the SOC substrate under previously-described operating conditions.

The insertion of diode circuits 1562, 1563 between the body regions and isolation structures of PLDMOSFETs 1516, 1518 is possible because the body regions and isolation structures of PLDMOSFETs 1516, 1518 are not merged, in various embodiments. More specifically, in the PLDMOS-FETs 1516, 1518 of FIG. 15, the body regions and isolation structures are separated by a region of P-type material, as mentioned previously, and as will be discussed in more detail in conjunction with FIGS. 16-28. With the body region and isolation structure separated, a body bias that may otherwise be created during operation (e.g., in the previously-described embodiments in which the body region and isolation structure are merged) is not created when a diode circuit is coupled to the source terminal. In addition, as with the previously-described embodiments, by inserting the diode circuits 1562-1563 between the body regions and isolation structures of PLDMOSFETs 1516, 1518, the injection current can be reduced or eliminated in system 1500. According to various embodiments, diode circuits 1552-1563 may include diodes with breakdown voltages that are less than, greater than, or equal to the lowest normal negative operating voltage, depending on the application.

Additional embodiments of PLDMOSFETs (e.g., PLD-MOSFET 1516) and associated diode circuits (e.g., diode circuit 1562) are described in more detail below. For example, according to an embodiment, a diode circuit 1562 coupling the body region and isolation structure of PLDMOSFET 1516 includes a Schottky diode. Such an embodiment is illustrated in FIG. 16, which is a cross-sectional view of a PLDMOSFET 1600 (e.g., PLDMOSFET 1516, FIG. 15) with a diode circuit (e.g., diode circuit 1562, FIG. 15) that includes a Schottky diode, as will be explained in more detail below. According to an embodiment, various regions of PLDMOS-FET 1600 (and PLDMOSFETs 2000, 2100, 2500, 2700, FIGS. 20, 21, 25, and 27, discussed later) have ring-shaped configurations oriented in planes that are perpendicular to the cross-section illustrated in FIG. 16. Although the figures and description herein particularly apply to a double gate finger configuration, the scope of the inventive subject matter is not limited to such configurations. Those of skill in the art would understand, based on the description herein, how to modify the illustrated and described embodiments to apply to configurations that include multiple (i.e., >2) gate fingers, where adjacent gate fingers may share a drain (e.g., drain region 1636).

PLDMOSFET 1600 is formed in and on a semiconductor substrate 1610 (e.g., the SOC substrate discussed in conjunction with FIG. 1), which has a top substrate surface 1612. According to an embodiment, PLDMOSFET 1600 includes an isolation structure that substantially surrounds a portion 1616 of the substrate associated with an active area 1630 of the PLDMOSFET 1600 (i.e., an area of the substrate 1610 within which an active device is formed). In other words, the active device may be considered to be contained by the isolation structure. The isolation structure is a box-type structure, which is formed from an NBL 1620 (located at a depth below the top substrate surface 1612) and an N-type sinker region 1622 extending from the top substrate surface 1612 to the depth of the NBL 1620. The sinker region 1622 may be formed using a single implantation procedure having an implant energy sufficient to enable the sinker region 1622 to extend to the NBL 1620, or the sinker region 1622 may be formed using multiple implantation procedures having different implant energies, thus forming a series of interconnected sinker sub-regions at different depths.

PLDMOSFET 1600 further includes an active device formed within the active area 1630. According to an embodiment, the active device includes a P-type drift region 1632, an N-type body region 1634, a P-type drain region 1636, a P-type source region 1638, and a gate electrode 1642 (and corresponding gate dielectric, not numbered). The drift region 1632 is formed within a central portion of the active area 1630, and extends from the top substrate surface 1612 into the substrate 1610 to a depth that is less than the depth of NBL 1620. The drain region 1636 is formed within the drift region 1632, and is more heavily doped than the drift region 1632. The drain region 1636 extends from the top substrate surface 1612 into the substrate 1610 to a depth significantly less than the depth of the drift region 1632. A conductive interconnect electrically couples the drain region 1636 to a drain terminal 1666.

The body region 1634 is formed between the drift region 1632 and the sinker region 1622, and extends from the top substrate surface 1612 into the substrate 1610 to a depth that is less than the depth of NBL 1620, and that may be greater than the depth of the drift region 1632 (although body region 1634 may extend to depths that are less than or substantially equal to the depth of the drift region 1632, as well). An N-type body contact region 1635 is formed within the body region 1634 between source region 1638 and sinker region 1622. The body contact region 1635 may be more heavily doped than the body region 1634. In an embodiment, the body region 1634 abuts the drift region 1632. In alternate embodiments, the body region 1634 may be laterally separated from the drift region 1632, or the body region 1634 may overlap the drift region 1632 (creating regions with dopant profiles that differ from that in the channel or drift region 1632).

According to an embodiment, the body region 1634 is laterally separated from the sinker region 1622 by a region 1637 of P-type material, referred to herein as a "P-type gap". According to an embodiment, the P-type gap 1637 is formed from a portion of P-type substrate material 1616 contained by the isolation structure, where the P-type gap 1637 extends between the body region 1634 and the sinker region 1622 toward the top substrate surface 1612. In alternate embodiments, the P-type gap 1637 may be formed from a P-type well (e.g., a high voltage P-well or a low voltage P-well) formed between the body region 1634 and the sinker region 1622.

Gate electrode 1642 is formed over a gate oxide on the top substrate surface 1612 generally between the drain region 1636 and the source region 1638. A conductive interconnect electrically couples the gate electrode 1642 to a gate terminal 1664. Source region 1638 is formed within the body region 1634, extending from the top substrate surface 1612 into the substrate 1610 to a depth significantly less than the depth of the body region 1634. The source region 1638 may be more heavily doped than the drift region 1632. A conductive interconnect electrically couples the source region 1638 to a source terminal 1662.

Figure 16:
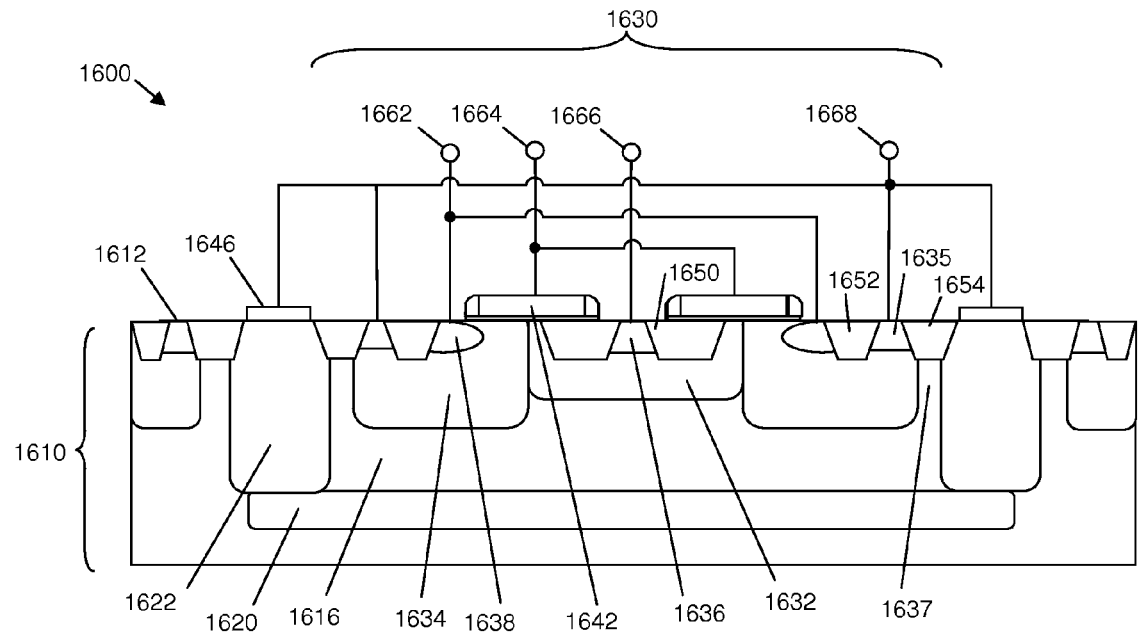
FIG. 16 is a cross-sectional view of a PLDMOSFET with a diode circuit that includes a Schottky diode, according to an alternate embodiment.

According to an embodiment, PLDMOSFET 1600 may further include various STI structures 1650, 1652, 1654 as shown in FIG. 16. For example, at the top substrate surface 1612, STI 1650 abuts the drain region 1636 within drift region 1632, STI 1652 is positioned between the source region 1638 and body contact region 1635, and STI 1654 is positioned between body region 1634 and the isolation structure (or more specifically, sinker region 1622). In alternate embodiments, one or more of STI structures 1650, 1652, and/or 1654 may be excluded. In still other alternate embodiments, some or all of the STI structures may be replaced with a silicide blocking layer that prevents silicide formation at the surface that would otherwise short the various regions together.

According to an embodiment, PLDMOSFET 1600 further includes a diode circuit (e.g., diode circuit 1562, FIG. 15) connected between body region 1634 (or more specifically body contact region 1635) and the isolation structure. More particularly, the diode circuit includes a Schottky diode formed from the metal-semiconductor junction between a Schottky contact 1646 (e.g., formed with silicide on the top substrate surface 1612) and the top surface of sinker region 1622. In an alternate embodiment, the Schottky contact 1646 may be formed on a sidewall or other surface that is not co-planar with the top substrate surface 1612. According to an embodiment, a conductive interconnect electrically couples the body region 1634 (via body contact region 1635), the Schottky contact 1646, and a body terminal 1668. The Schottky diode can be designed to provide a desired application-dependent breakdown voltage (e.g., a breakdown voltage greater than, less than, or equal to the normal, most negative operating voltage). For example, in an embodiment, the Schottky diode is designed to provide a reverse breakdown voltage in a range of about −0.3 volts to about −14.0 volts, although smaller or larger breakdown voltages may be achieved, as well.

As mentioned previously, and as indicated in FIG. 15, body region 1634 and source region 1638 may be electrically coupled (shorted) through a conductive interconnect (not illustrated in FIG. 16), and the diode circuit (e.g., diode circuit 1562, FIG. 15) may be electrically coupled between the isolation structure (e.g., sinker region 1622) and the shorted source and body regions. In other words, source terminal 1662 and body terminal 1668 may be shorted together. During normal operation, when the body region 1634, source region 1638, and isolation structure all are at high potentials, the isolation structure and body region 1634 can be effectively shorted through the lateral depletion of the P-type gap 1637 between them (e.g., which may be completely depleted before breakdown between them), or through the vertical depletion of the portion of the P-type substrate between the body region 1634 and NBL 1620, whichever comes first.

Figure 17:
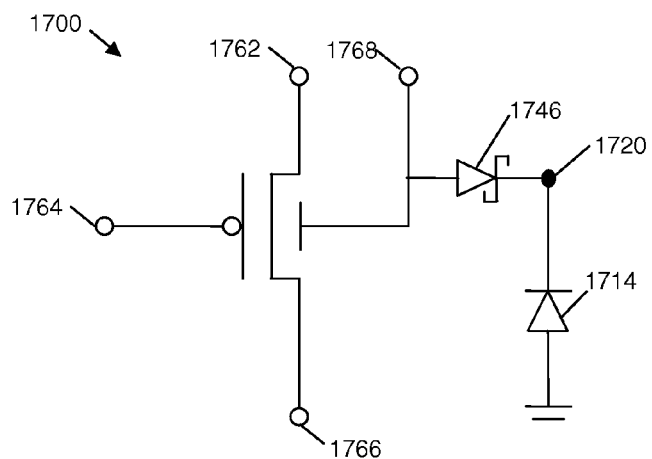
FIG. 17 is a simplified circuit representation of the PLD-MOSFET of FIG. 16, according to an embodiment.

FIG. 17 is a simplified circuit representation 1700 of the PLDMOSFET 1600 of FIG. 16, according to an embodiment. Referring also to FIG. 16, terminal 1762 (e.g., terminal 1662) is coupled with the source region (e.g., source region 1638), terminal 1764 (e.g., terminal 1664) is coupled with the gate electrode (e.g., gate electrode 1642), terminal 1766 (e.g., terminal 1666) is coupled with the drain region (e.g., drain region 1636), and terminal 1768 (e.g., terminal 1668 is coupled to the body region (e.g., via body contact region 1635).

According to an embodiment, and as discussed above, the PLDMOSFET also includes Schottky diode 1746 (e.g., the interface between Schottky contact 1646 and sinker region 1622) electrically coupled between the body region (e.g., body region 1634) and the device's isolation structure. More specifically, the anode of the Schottky diode 1746 is coupled to the body region, and the cathode of the Schottky diode 1746 is formed by the isolation structure (e.g., the combination of sinker region 1622 and NBL 1620). At node 1720, diode 1714 represents the diode formed by the interface between the isolation structure and the portion of the substrate outside of the isolation structure.

During normal operation in which the body region potential is elevated, the Schottky diode 1746 is forward biased. Accordingly, the isolation structure potential closely follows that of the body region with only a small forward voltage drop at the Schottky barrier. On the other hand, when the body potential transitions to a negative voltage, the isolation structure potential is held up by the reverse breakdown voltage of the Schottky diode 1746 (e.g., between about −0.3 volts to about −14.0 volts). By holding up the potential of the isolation structure when the body potential goes negative, carrier injection into the substrate that may otherwise occur if the body and isolation structure were merely shorted may be reduced or eliminated, thus avoiding disruption of adjacent circuit blocks.

Figure 18:
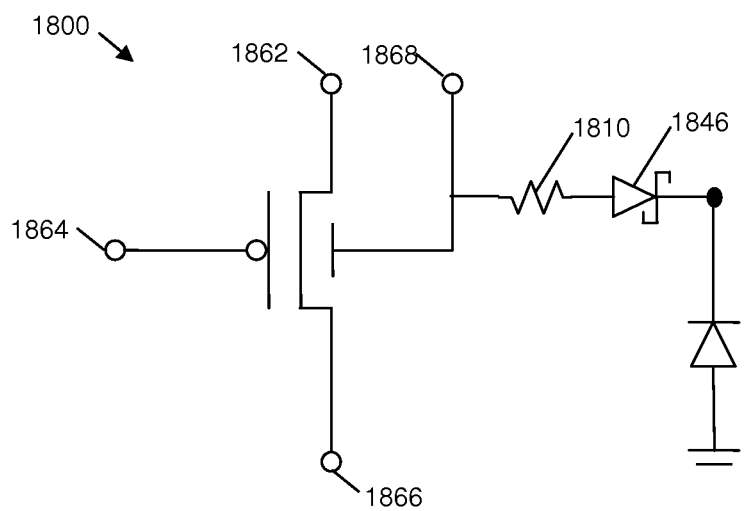
FIG. 18 is a simplified circuit representation of the PLD-MOSFET of FIG. 16 with a diode circuit that includes a resistive network in series with a Schottky diode, according to an alternate embodiment.

According to another embodiment, the diode circuit (e.g., diode circuit 1562, FIG. 15) may include a resistive network in series with a Schottky diode. For example, FIG. 18 is a simplified circuit representation 1800 of the PLDMOSFET 1600 of FIG. 16 with a diode circuit that includes a resistive network 1810 in series with a Schottky diode 1846, according to an alternate embodiment. Similar to the embodiment of FIG. 17, terminal 1862 (e.g., terminal 1662) is coupled with the source region (e.g., source region 1638), terminal 1864 (e.g., terminal 1664) is coupled with the gate electrode (e.g., gate electrode 1642), terminal 1866 (e.g., terminal 1666) is coupled with the drain region (e.g., drain region 1636), and terminal 1868 (e.g., terminal 1668) is coupled with the body region (e.g., via body contact region 1635).

Schottky diode 1846 (e.g., the interface between Schottky contact 1646 and sinker region 1622) and resistive network 1810 are electrically coupled in series between the body region (e.g., body region 1634) and the device's isolation structure. For example, resistive network 1810 may be formed from polycrystalline silicon, and may be located on an insulated region of the top surface of the substrate (e.g., on STI 1652 or 1654). Alternatively, resistive network 1810 may be formed from other materials and/or located elsewhere. During operation, when the body potential transitions to a negative voltage, the isolation structure potential is held up by the voltage drop across resistive network 1810 in series with the reverse breakdown voltage of the Schottky diode 1846 (e.g., between about −0.3 volts to about −14.0 volts). The combination of the Schottky diode 1846 and resistive network 1810 may allow for more flexibility in the construction of the Schottky diode 1846. In addition, in choosing a value for resistive network 1810 to achieve optimum overall results in maintaining the PLDMOSFET's integrity, electrostatic discharge (ESD) robustness may be achieved while reducing substrate injection. More specifically, for example, under conditions in which the Schottky diode 1846 is run into breakdown (e.g., during ESD stress), the current through the Schottky diode 1846 is limited by resistive network 1810 to the extent of its capability, thus reducing the likelihood that an ESD event may damage Schottky diode 1846.

Figure 19:
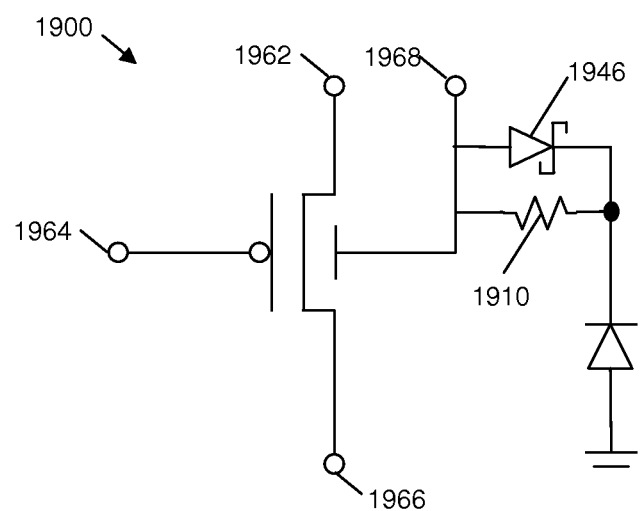
FIG. 19 is a simplified circuit representation of the PLD-MOSFET of FIG. 16 with a diode circuit that includes a resistive network in parallel with a Schottky diode, according to another alternate embodiment.

According to yet another embodiment, the diode circuit (e.g., diode circuit 1562, FIG. 15) may include a resistive network in parallel with a Schottky diode. For example, FIG. 19 is a simplified circuit representation 1900 of the PLDMOSFET 1600 of FIG. 16 with a diode circuit that includes a resistive network 1910 in parallel with a Schottky diode 1946, according to an alternate embodiment. Similar to the embodiment of FIG. 16, terminal 1962 (e.g., terminal 1662) is coupled with the source region (e.g., source region 1638), terminal 1964 (e.g., terminal 1664) is coupled with the gate electrode (e.g., gate electrode 1642), terminal 1966 (e.g., terminal 1666) is coupled with the drain region (e.g., drain region 1636), and terminal 1968 (e.g., terminal 1668) is coupled with the body region (e.g., via body contact region 1635).

Schottky diode 1946 (e.g., the interface between Schottky contact 1646 and sinker region 1622) and resistive network 1910 are electrically coupled in parallel between the body region (e.g., body region 1634) and the device's isolation structure. For example, resistive network 1910 may be formed from polycrystalline silicon, and may be located on an insulated region of the top surface of the substrate (e.g., on STI 1652 or 1654). Alternatively, resistive network 1910 may be formed from other materials and/or located elsewhere. During operation, when the body potential transitions to a negative voltage, the isolation structure potential is held up by the voltage drop across resistive network 1910 in parallel with the reverse breakdown voltage of the Schottky diode 1946 (e.g., between about −0.3 volts to about −14.0 volts). As with the diode circuit discussed in conjunction with FIG. 18, the combination of the Schottky diode 1946 and resistive network 1910 may allow for more flexibility in the construction of the Schottky diode 1946. In addition, resistive network 1910 may function to maintain the potential of the isolation structure closer to the body potential of the PLDMOSFET, under certain circumstances. For example, when the body potential is falling (although still positive), the potential of the isolation structure is pulled down only by the capacitance of Schottky diode 1946, which may or may not be sufficient. In such a case, resistive network 1910 may help to discharge the potential of the isolation structure towards the body potential. Although some minority carrier injection may be added when the body potential transitions negative, resistive network 1910 may limit the amount of carrier injection.

In the embodiments discussed in conjunction with FIGS. 18 and 19, a diode circuit (e.g., diode circuit 1562, FIG. 15) includes a Schottky diode (e.g., Schottky diodes 1846, 1946) and either a resistive network coupled in series (resistive network 1810) or a resistive network coupled in parallel (resistive network 1910) with the Schottky diode. In another alternate embodiment, a diode circuit may include a Schottky diode and both a first resistive network coupled in series and a second resistive network coupled in parallel with the Schottky diode, in order to realize the advantages that may be provided by both the series-coupled and parallel-coupled resistive network arrangements.

Figure 20:
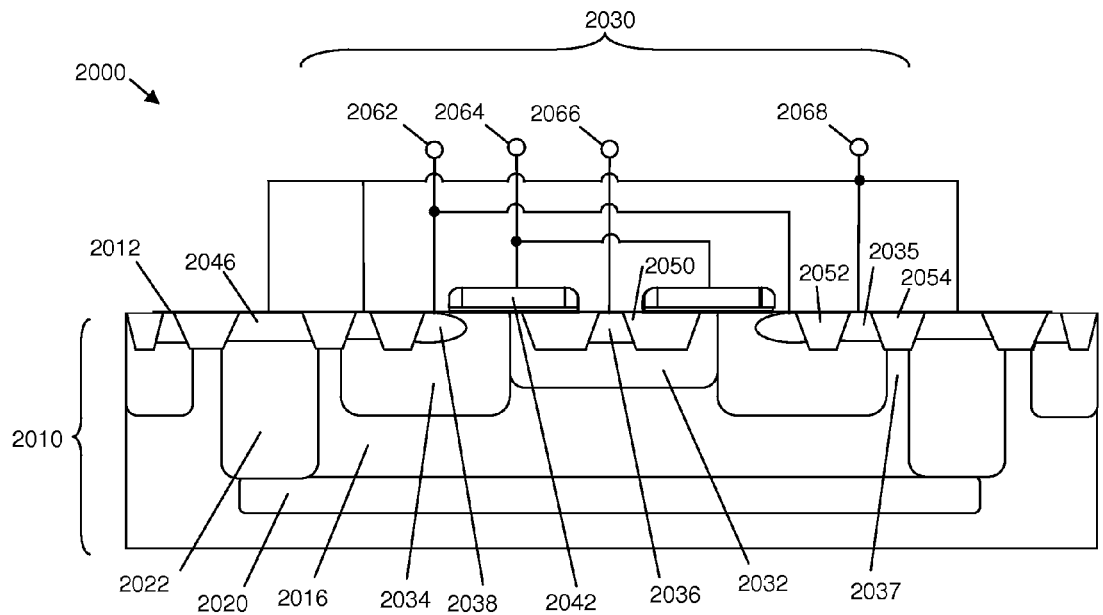
FIG. 20 is a cross-sectional view of a PLDMOSFET with a diode circuit that includes a PN junction diode, according to an alternate embodiment.
Figure 21:
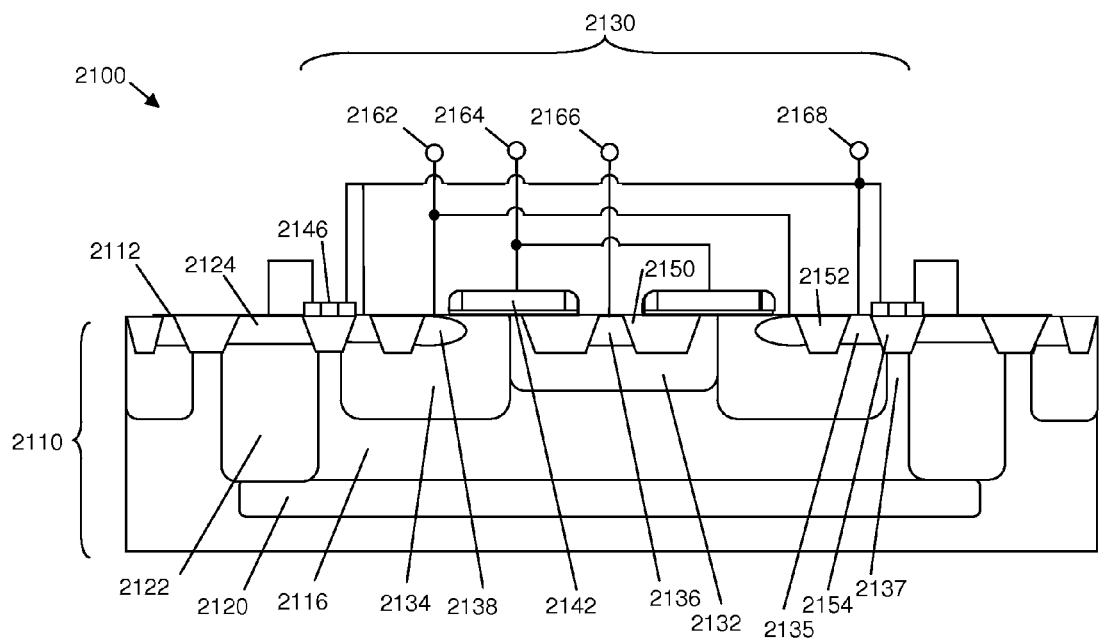
FIG. 21 is a cross-sectional view of a PLDMOSFET with a diode circuit that includes a polycrystalline silicon diode, according to another alternate embodiment.

In the embodiments discussed in conjunction with FIGS. 16-19, a diode circuit (e.g., diode circuit 1562, FIG. 15) coupling the body region and isolation structure of an embodiment of a PLDMOSFET (e.g., PLDMOSFET 1516, FIG. 15) includes a Schottky diode. According to other embodiments, a diode circuit coupling the body region and isolation structure of an embodiment of a PLDMOSFET instead includes a PN junction diode (e.g., including either a PN junction (FIG. 20) or a polycrystalline silicon diode (FIG. 21)). For example, FIGS. 20 and 21 are cross-sectional views of PLDMOSFETs 2000, 2100 (e.g., PLDMOSFET 1516, FIG. 15), each with a diode circuit (e.g., diode circuit 1562, FIG. 15) that includes a PN junction diode. Much of the structure of the PLDMOSFETs 2000, 2100 (FIGS. 20, 21) is similar to the structure of PLDMOSFET 1600 discussed in detail in conjunction with FIG. 16. For brevity, the similar structural elements are not discussed in detail below, but the discussion in conjunction with FIG. 16 is intended to apply equally to FIGS. 20 and 21. In addition, common elements of FIGS. 20 and 21 are discussed together, below, and the differences between the devices are specified thereafter.

PLDMOSFETs 2000, 2100 are formed in and on a P-type semiconductor substrate 2010, 2110 (e.g., the SOC substrate discussed in conjunction with FIG. 15), which has a top substrate surface 2012, 2112. Each PLDMOSFET 2000, 2100 includes an isolation structure that substantially surrounds a portion 2016, 2116 of the substrate 2010, 2110 corresponding to an active area 2030, 2130 of the PLDMOSFET 2000, 2100. The isolation structure is formed from NBL 2020, 2120 (located at a depth below the top substrate surface 2012, 2112) and an N-type sinker region 2022, 2122 extending from the top substrate surface 2012, 2112 to the depth of the NBL 2020, 2120. PLDMOSFET 2000, 2100 further includes an active device formed within the active area 2030, 2130. According to an embodiment, the active device includes an P-type drift region 2032, 2132, an N-type body region 2034, 2134, an N-type body contact region 2035, 2135, a P-type drain region 2036, 2136, a P-type source region 2038, 2138, and a gate electrode 2042, 2142. In an embodiment, the body region 2034, 2134 abuts the drift region 2032, 2132. In addition, the body region 2034, 2134 is laterally separated from the sinker region 2022, 2122 by a P-type gap 2037, 2137, in an embodiment, as shown in FIGS. 20 and 21. In alternate embodiments, the body region 2034, 2134 may be laterally separated from the drift region 2032, 2132, or the body region 2034, 2134 may overlap the drift region 2032, 2132 (creating regions with dopant profiles that differ from that in the channel or drift region 2032, 2132). A conductive interconnect electrically couples the drain region 2036, 2136 to a drain terminal 2066, 2166. In addition, a conductive interconnect electrically couples the gate electrode 2042, 2142 to a gate terminal 2064, 2164. Further, a conductive interconnect electrically couples the source region 2038, 2138 to a source terminal 2062, 2162. PLDMOSFET 2000, 2100 may further include STI structures 2050, 2150, 2052, 2152, 2054, 2154. In alternate embodiments, some or all of STI structures 2050, 2150, 2052, 2152, 2054, and/or 2154 may be excluded. In still other alternate embodiments, some or all of the STI structures may be replaced with a silicide blocking layer.

According to an embodiment, PLDMOSFET 2000 (FIG. 20) further includes a diode circuit (e.g., diode circuit 1562, FIG. 15) that includes a PN junction diode connected between body region 2034 (via body contact region 2035) and the isolation structure. More particularly, PLDMOSFET 2000 further includes a P-type region 2046 extending into sinker region 2022, where P-type region 2046 may be more heavily doped than P-type drift region 2032. The PN junction between P-type region 2046 and sinker region 2022 forms the PN junction diode of the diode circuit. According to an embodiment, a conductive interconnect electrically couples the body region 2034 (via body contact region 2035), the P-type region 2046, and a body terminal 2068. The PN junction diode can be designed to provide a desired application-dependent breakdown voltage (e.g., a breakdown voltage greater than, less than, or equal to the normal, most negative operating voltage). For example, in an embodiment, the PN junction diode may be designed to provide a reverse breakdown voltage in a range of about −0.3 volts to about −14.0 volts, although smaller or larger breakdown voltages may be achieved, as well.

According to another embodiment, PLDMOSFET 2100 (FIG. 21) further includes a diode circuit (e.g., diode circuit 1562, FIG. 15) that includes a polycrystalline silicon diode 2146, which is connected between body region 2134 (via body contact region 2135) and an N-type region 2124 extending into the sinker region 2122, where N-type region 2124 is more heavily doped than sinker region 2122 to provide for Ohmic contact to sinker region 2122. For example, polycrystalline silicon diode 2146 may be formed from a P-type region and an N-type region separated by a neutral spacer region that defines the breakdown voltage of polycrystalline silicon diode 2146. Polysilicon diode 2146 may be formed on an insulated region of the top surface of the substrate (e.g., on STI 2154, as shown). Alternatively, diode 2146 may be formed from other materials and/or located elsewhere. In an embodiment, the polycrystalline silicon diode 2146 may be designed to provide a desired application-dependent reverse breakdown voltage greater than, less than, or equal to the normal, most negative operating voltage (e.g., a breakdown voltage in a range of about −0.3 volts to about −14.0 volts, although smaller or larger breakdown voltages may be achieved, as well). According to an embodiment, a conductive interconnect electrically couples the body region 2134 (via body contact region 2135), the anode of polycrystalline silicon diode 2146, and a body terminal 2168. An additional conductive interconnect electrically couples the cathode of polycrystalline silicon diode 2146 to sinker region 2122 at the top substrate surface 2112.

Figure 22:
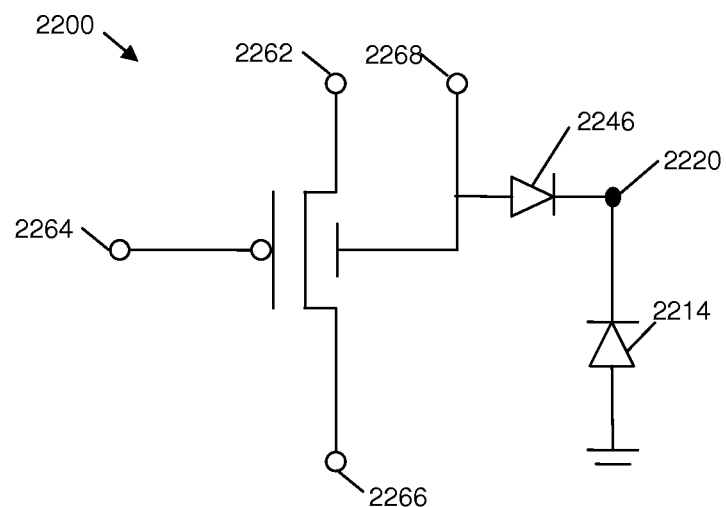
FIG. 22 is a simplified circuit representation of the PLD-MOSFETs of FIGS. 20 and 21, according to an embodiment.

FIG. 22 is a simplified circuit representation 2200 of the PLDMOSFET 2000, 2100 of FIGS. 20 and 21, according to an embodiment. Referring also to FIGS. 20 and 21, terminal 2262 (e.g., terminal 2062, 2162) is coupled with the source region (e.g., source region 2038, 2138), terminal 2264 (e.g., terminal 2064, 2164) is coupled with the gate electrode (e.g., gate electrode 2042, 2142), terminal 2266 (e.g., terminal 2066, 2166) is coupled with the drain region (e.g., drain region 2036, 2136), and terminal 2268 (e.g., terminal 2068, 2168) is coupled with the body region (e.g., via body contact region 2035, 2135).

According to an embodiment, and as discussed above, the PLDMOSFET also includes PN junction diode 2246 (e.g., the PN junction diode formed between P+ region 2046 and sinker region 2022, or polycrystalline silicon diode 2146) electrically coupled between the body region (e.g., body region 2034, 2134) and the device's isolation structure. More specifically, the anode of the PN junction diode 2246 is coupled to the body region, and the cathode of the PN junction diode 2246 is formed by the isolation structure (e.g., the combination of sinker region 2022, 2122 and NBL 2020, 2120). At node 2220, diode 2214 represents the diode formed by the interface between the isolation structure and the portion of the substrate outside of the isolation structure.

During normal operation in which the body region potential is elevated, the PN junction diode 2246 is forward biased. Accordingly, the isolation structure potential closely follows that of the body region with a relatively small forward voltage drop at the PN junction. On the other hand, when the body potential transitions to a negative voltage, the isolation structure potential is held up by the reverse breakdown voltage of the PN junction diode 2246 (e.g., between about −0.3 volts to about −14.0 volts or more). As with the embodiment previously discussed in conjunction with FIG. 16, by holding up the potential of the isolation structure when the body potential goes negative, carrier injection into the substrate that may otherwise occur if the body and isolation structure were merely shorted may be reduced or eliminated, thus avoiding disruption of adjacent circuit blocks.

Figure 23:
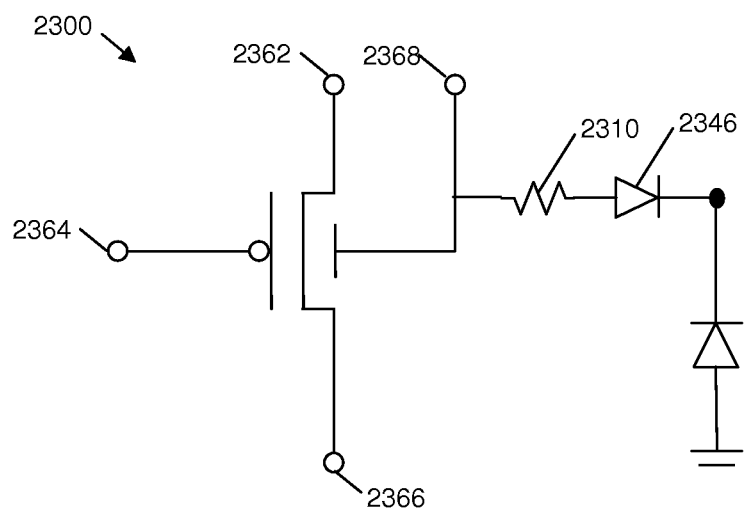
FIG. 23 is a simplified circuit representation of the PLD-MOSFETs of FIGS. 20, 21 with a diode circuit that includes a resistive network in series with a PN junction diode, according to an alternate embodiment.

According to another embodiment, the diode circuit (e.g., diode circuit 1562, FIG. 15) may include a resistive network in series with a PN junction diode. For example, FIG. 23 is a simplified circuit representation 2300 of the PLDMOSFETs 2000, 2100 of FIGS. 20, 21 with a diode circuit that includes a resistive network 2310 in series with a PN junction diode 2346, according to an alternate embodiment. Similar to the embodiment of FIG. 22, terminal 2362 (e.g., terminal 2062, 2162) is coupled with the source region (e.g., source region 2038, 2138), terminal 2364 (e.g., terminal 2064, 2164) is coupled with the gate electrode (e.g., gate electrode 2042, 2142), terminal 2366 (e.g., terminal 2066, 2166) is coupled with the drain region (e.g., drain region 2036, 2136), and terminal 2368 (e.g., terminal 2068, 2168) is coupled with the body region (e.g., via body contact region 2035, 2135).

PN junction diode 2346 (e.g., the PN junction diode formed between P+ region 2046 and sinker region 2022, or polycrystalline silicon diode 2146) and resistive network 2310 are electrically coupled in series between the body region (e.g., body region 2034, 2134) and the device's isolation structure. For example, resistive network 2310 may be formed from polycrystalline silicon, and may be located on an insulated region of the top surface of the substrate (e.g., on STI 2052, 2152, 2054, 2154). Alternatively, resistive network 2310 may be formed from other materials and/or located elsewhere. During operation, when the body potential transitions to a negative voltage, the isolation structure potential is held up by the voltage drop across resistive network 2310 in series with the reverse breakdown voltage of the PN junction diode 2346 (e.g., between about −0.3 volts to about −14.0 volts or more). As with the embodiment previously discussed in conjunction with FIG. 18, the combination of the PN junction diode 2346 and resistive network 2310 may provide certain advantageous effects.

Figure 24:
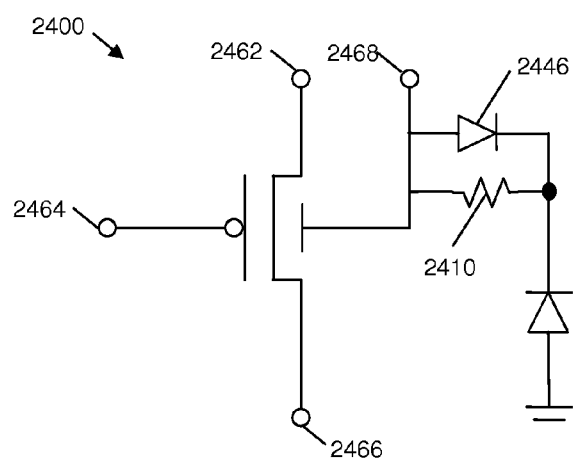
FIG. 24 is a simplified circuit representation of the PLD-MOSFETs of FIGS. 20, 21 with a diode circuit that includes a resistive network in parallel with a PN junction diode, according to another alternate embodiment.

According to yet another embodiment, the diode circuit (e.g., diode circuit 1562, FIG. 15) may include a resistive network in parallel with a PN junction diode. For example, FIG. 24 is a simplified circuit representation 2400 of the PLDMOSFETs 2000, 2100 of FIGS. 20, 21 with a diode circuit that includes a resistive network 2410 in parallel with a PN junction diode 2446, according to an alternate embodiment. Similar to the embodiment of FIG. 22, terminal 2462 (e.g., terminal 2062, 2162) is coupled with the source region (e.g., source region 2038, 2138), terminal 2464 (e.g., terminal 2064, 2164) is coupled with the gate electrode (e.g., gate electrode 2042, 2142), terminal 2466 (e.g., terminal 2066, 2166) is coupled with the drain region (e.g., drain region 2036, 2136), and terminal 2468 (e.g., terminal 2068, 2168) is coupled with the body region (e.g., via body contact region 2035, 2135).

PN junction diode 2446 (e.g., the PN junction diode formed between P+ region 2046 and sinker region 2022, or polycrystalline silicon diode 2146) and resistive network 2410 are electrically coupled in parallel between the body region (e.g., body region 2034, 2134) and the device's isolation structure. For example, resistive network 2410 may be formed from polycrystalline silicon, and may be located on an insulated region of the top surface of the substrate (e.g., on STI 2052, 2152, 2054, 2154). Alternatively, resistive network 2410 may be formed from other materials and/or located elsewhere. During operation, when the body potential transitions to a negative voltage, the isolation structure potential is held up by the voltage drop across resistive network 2410 in parallel with the reverse breakdown voltage of the PN junction diode 2446 (e.g., between about −0.3 volts to about −14.0 volts or more). As with the diode circuit discussed in conjunction with FIG. 19, the combination of the PN junction diode 2446 and resistive network 2410 may have certain advantageous effects.

In the embodiments discussed in conjunction with FIGS. 23 and 24, a diode circuit (e.g., diode circuit 162, FIG. 1) includes a PN junction diode (e.g., PN junction diodes 2346, 2446) and either a resistive network coupled in series (resistive network 2310) or a resistive network coupled in parallel (resistive network 2410) with the PN junction diode. In another alternate embodiment, a diode circuit may include a PN junction diode and both a first resistive network coupled in series and a second resistive network coupled in parallel with the PN junction diode, in order to realize the advantages that may be provided by both the series-coupled and parallel-coupled resistive network arrangements.

Figure 25:
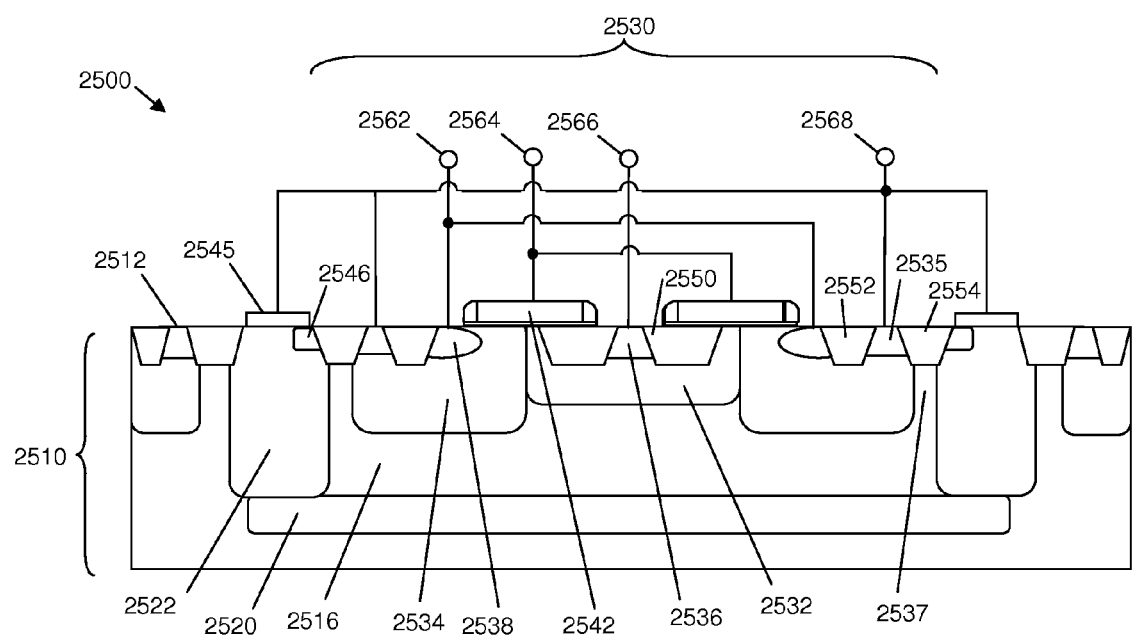
FIG. 25 is a cross-sectional view of a PLDMOSFET with a diode circuit that includes a combination of one or more Schottky diodes and one or more PN junction diodes, according to an embodiment.
Figure 27:
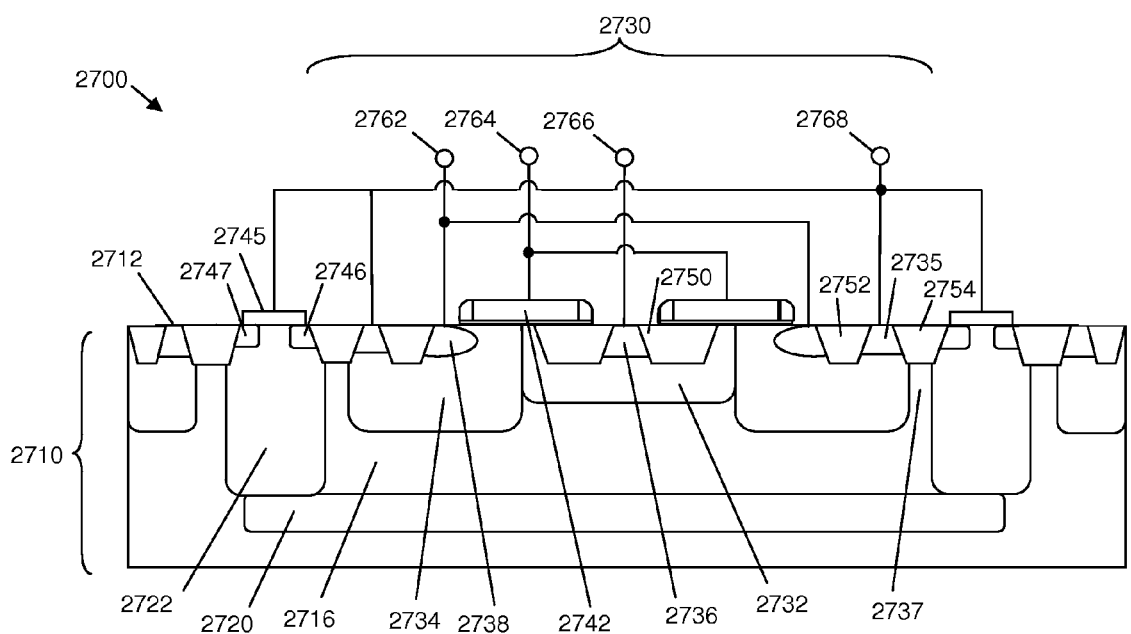
FIG. 27 is a cross-sectional view of a PLDMOSFET with a diode circuit that includes a combination of one or more Schottky diodes and one or more PN junction diodes, according to an alternate embodiment.

In the embodiments discussed in conjunction with FIGS. 16-24, a diode circuit (e.g., diode circuit 1562, FIG. 15) coupling the body region and isolation structure of an embodiment of a PLDMOSFET (e.g., PLDMOSFET 1516, FIG. 15) includes either a Schottky diode or a PN junction diode. According to other embodiments, a diode circuit coupling the body region and isolation structure of an embodiment of a PLDMOSFET instead includes a combination of one or more Schottky diodes and one or more PN junction diodes. For example, FIGS. 25 and 27 are cross-sectional views of PLDMOSFETs 2500, 2700 (e.g., PLDMOSFET 1516, FIG. 15), each with a diode circuit (e.g., diode circuit 1562, FIG. 15) that includes a combination of one or more Schottky diodes and one or more PN junction diodes. Again, much of the structure of the PLDMOSFETs 2500, 2700 (FIGS. 25, 27) is similar to the structure of PLDMOSFET 1600 discussed in detail in conjunction with FIG. 16. For brevity, the similar structural elements are not discussed in detail below, but the discussion in conjunction with FIG. 16 is intended to apply equally to FIGS. 25 and 27. In addition, common elements of FIGS. 25 and 27 are discussed together, below, and the differences between the devices are specified thereafter.

PLDMOSFETs 2500, 2700 are formed in and on a P-type semiconductor substrate 2510, 2710 (e.g., the SOC substrate discussed in conjunction with FIG. 1), which has a top substrate surface 2512, 2712. Each PLDMOSFET 2500, 2700 includes an isolation structure that substantially surrounds a portion 2516, 2716 of the substrate 2510, 2710 associated with an active area 2530, 2730 of the PLDMOSFET 2500, 2700. The isolation structure is formed from NBL 2520, 2720 (located at a depth below the top substrate surface 2512, 2712), and an N-type sinker region 2522, 2722 extending from the top substrate surface 2512, 2712 to the depth of the NBL 2520, 2720. PLDMOSFET 2500, 2700 further includes an active device formed within the active area 2530, 2730. According to an embodiment, the active device includes a P-type drift region 2532, 2732, an N-type body region 2534, 2734, an N-type body contact region 2535, 2735, a P-type drain region 2536, 2736, a P-type source region 2538, 2738, and a gate electrode 2542, 2742. In an embodiment, the body region 2534, 2734 abuts the drift region 2532, 2732. In addition, the body region 2534, 2734 is laterally separated from the sinker region 2522, 2722 by a P-type gap 2537, 2737, in an embodiment, as shown in FIGS. 25 and 27. In alternate embodiments, the body region 2534, 2734 may be laterally separated from the drift region 2532, 2732, or the body region 2534, 2734 may overlap the drift region 2532, 2732 (creating regions with dopant profiles that differ from that in the channel or drift region 2532, 2732). A conductive interconnect electrically couples the drain region 2536, 2736 to a drain terminal 2566, 2766. In addition, a conductive interconnect electrically couples the gate electrode 2542, 2742 to a gate terminal 2564, 2764. Further, a conductive interconnect electrically couples the source region 2538, 2738 to a source terminal 2562, 2762. PLDMOSFET 2500, 2700 may further include STI structures 2550, 2750, 2552, 2752, 2554, 2754. In alternate embodiments, some or all of STI structures 2550, 2750, 2552, 2752, 2554, and/or 2754 may be excluded. In still other alternate embodiments, some or all of the STI structures may be replaced with a silicide blocking layer.

According to an embodiment, PLDMOSFET 2500 (FIG. 25) further includes a diode circuit (e.g., diode circuit 1562, FIG. 15) that includes a combination of a Schottky diode and a PN junction diode connected in parallel between body region 2534 (via body contact region 2535) and the isolation structure. More particularly, the diode circuit includes a Schottky diode formed from the metal-semiconductor junction between a Schottky contact 2545 (e.g., formed with silicide on the top substrate surface 2512) and the top surface of sinker region 2522. In addition, PLDMOSFET 2500 further includes a P-type region 2546 extending into sinker region 2522 and partially across the sinker region 2522. The PN junction between P-type region 2546 and sinker region 2522 forms the PN junction diode of the diode circuit. At the substrate surface 2512, the Schottky contact 2545 contacts both the top surface of the P-type region 2546 and a portion of the top surface of the sinker region 2522. According to an embodiment, placing the PN diode alongside the Schottky diode allows the PN junction to deplete the silicon under the Schottky diode, thus reducing reverse-biased leakage in the Schottky diode.

According to an embodiment, a conductive interconnect electrically couples the body region 2534, the Schottky contact 2545, the P-type region 2546, and a body terminal 2568. The Schottky diode and the PN junction diode can be designed to provide a desired application-dependent breakdown voltage (e.g., a breakdown voltage greater than, less than, or equal to the normal, most negative operating voltage). For example, in an embodiment, the Schottky diode and the PN junction diode each may be designed to provide a reverse breakdown voltage in a range of about −0.3 volts to about −14.0 volts, although smaller or larger breakdown voltages may be achieved, as well.

Figure 26:
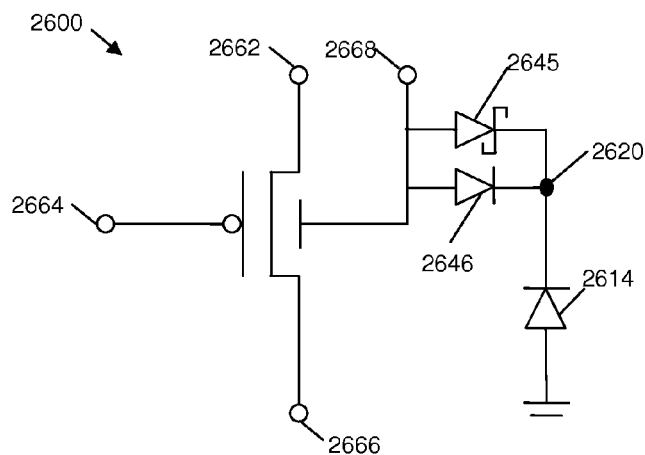
FIG. 26 is a simplified circuit representation of the PLD-MOSFET of FIG. 25, according to an embodiment.

FIG. 26 is a simplified circuit representation 2600 of the PLDMOSFET 2500 of FIG. 25, according to an embodiment. Referring also to FIG. 25, terminal 2662 (e.g., terminal 2562) is coupled with the source region (e.g., source region 2538), terminal 2664 (e.g., terminal 2564) is coupled with the gate electrode (e.g., gate electrode 2542), terminal 2666 (e.g., terminal 2566) is coupled with the drain region (e.g., drain region 2536), and terminal 2668 (e.g., terminal 2568) is coupled with the body region (e.g., via body contact region 2535).

According to an embodiment, and as discussed above, the PLDMOSFET also includes Schottky diode 2645 (e.g., the interface between Schottky contact 2545 and sinker region 2522) in parallel with PN junction diode 2646 (e.g., the PN junction diode formed between P+ region 2546 and sinker region 2522), which are electrically coupled between the body region (e.g., body region 2534) and the device's isolation structure. According to an embodiment, and as illustrated in FIG. 25, the PN junction diode 2646 consists of the interface between P+ region 2546 and sinker region 2522. The anodes of the Schottky diode 2645 and the PN junction diode 2646 are coupled to the body region, and the cathodes of the Schottky diode 2645 and the PN junction diode 2646 are formed by the isolation structure (e.g., the combination of sinker region 2522 and NBL 2520). In other alternate embodiments, the diode circuit may include one or more resistive networks coupled in series and/or in parallel with the combination of the Schottky diode 2645 and the PN junction diode 2646, as previously discussed in conjunction with FIGS. 18, 19, 23, and 24. At node 2620, diode 2614 represents the diode formed by the interface between the isolation structure and the portion of the substrate outside of the isolation structure.

According to another embodiment, PLDMOSFET 2700 (FIG. 27) includes a diode circuit (e.g., diode circuit 1562, FIG. 15) that includes a combination of a Schottky diode and a "split" PN junction diode connected in parallel between body region 2734 (via body contact region 2735) and the isolation structure. More particularly, the diode circuit includes a Schottky diode formed from the metal-semiconductor junction between a Schottky contact 2745 (e.g., formed with silicide on the top substrate surface 2712) and the top surface of sinker region 2722. In addition, PLDMOSFET 2700 further includes a first P-type region 2746 extending into sinker region 2722 and partially across the sinker region 2722 at an interior wall of the sinker region 2722 (i.e., the wall closest to the active region 2730), and a second P-type region 2747 extending into sinker region 2722 and partially across the sinker region 2722 at an exterior wall of the sinker region 2722 (i.e., the wall farthest from the active region 2730). A portion of the sinker region 2722 is present at the top substrate surface 2712 between the first and second P-type regions 2746, 2747, and Schottky contact 2745 contacts at least that portion of the sinker region 2722.

The PN junctions between P-type regions 2746, 2747 and sinker region 2722 form the PN junction diodes of the diode circuit. At the substrate surface 2712, the Schottky contact 2745 contacts both the top surface of the first and second P-type regions 2746, 2747 and a portion of the top surface of the sinker region 2722. By placing multiple P-type regions 2746, 2747 close together and interleaved with the Schottky barrier, the P-type regions 2746, 2747 may help to deplete the Schottky barrier area under reverse bias to limit the leakage current.

According to an embodiment, a conductive interconnect electrically couples the body region 2734, the Schottky contact 2745, the P-type regions 2746, 2747, and a body terminal 2768. The Schottky diode and the PN junction diodes can be designed to provide a desired application-dependent breakdown voltage (e.g., a breakdown voltage greater than, less than, or equal to the normal, most negative operating voltage). For example, in an embodiment, the Schottky diodes and the PN junction diodes each may be designed to provide a reverse breakdown voltage in a range of about −0.3 volts to about −14.0 volts, although smaller or larger breakdown voltages may be achieved, as well.

Figure 28:
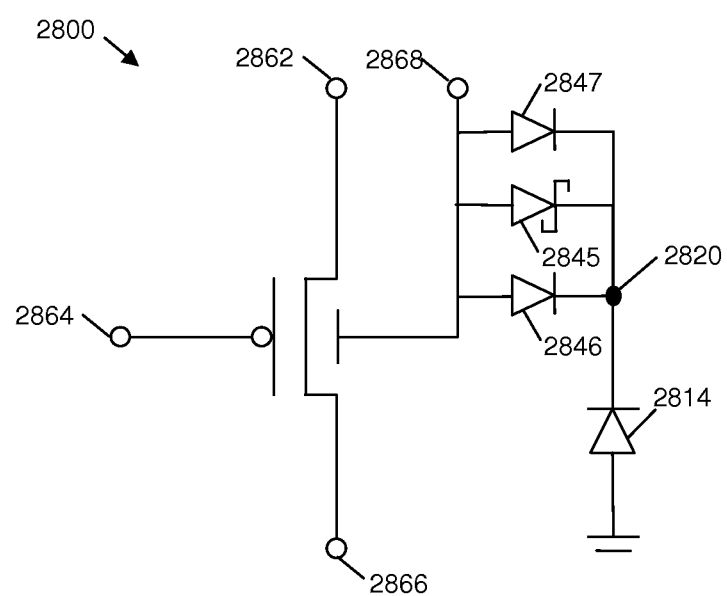
FIG. 28 is a simplified circuit representation of the PLD-MOSFET of FIG. 27, according to an embodiment.

FIG. 28 is a simplified circuit representation 2800 of the PLDMOSFET 2700 of FIG. 27, according to an embodiment. Referring also to FIG. 27, terminal 2862 (e.g., terminal 2762) is coupled with the source region (e.g., source region 2738), terminal 2864 (e.g., terminal 2764) is coupled with the gate electrode (e.g., gate electrode 2742), terminal 2866 (e.g., terminal 2766) is coupled with the drain region (e.g., drain region 2736), and terminal 2868 (e.g., terminal 2768) is coupled with the body region (e.g., via body contact region 2735).

According to an embodiment, and as discussed above, the PLDMOSFET also includes Schottky diode 2845 (e.g., the interface between Schottky contact 2745 and sinker region 2722) in parallel with first and second PN junction diodes 2846, 2847 (e.g., the PN junction diodes formed between P+ regions 2746, 2747 and sinker region 2722), which are electrically coupled between the body region (e.g., body region 2734) and the device's isolation structure. According to an embodiment, and as illustrated in FIG. 27, the PN junction diodes 2846, 2847 consist of the interface between P+ regions 2746, 2747 and sinker region 2722. The anodes of the Schottky diode 2845 and the PN junction diodes 2846, 2847 are coupled to the body region, and the cathodes of the Schottky diode 2845 and the PN junction diodes 2846, 2847 are formed by the isolation structure (e.g., the combination of sinker region 2722 and NBL 2720). In other alternate embodiments, the diode circuit may include one or more resistive networks coupled in series and/or in parallel with the combination of the Schottky diode 2845 and the PN junction diodes 2846, 2847, as previously discussed in conjunction with FIGS. 18, 19, 23, and 24. At node 2820, diode 2814 represents the diode formed by the interface between the isolation structure and the remainder of the substrate outside of the isolation structure.

Referring to both FIGS. 26 and 28, during normal operation in which the body region potential is elevated, the Schottky diode 2645, 2845 and PN junction diode(s) 2646, 2846, 2847 are forward biased, and the Schottky diode 2645, 2845 clamps the forward bias of the PN junction diode(s) 2646, 2846, 2847. Accordingly, the isolation structure potential closely follows that of the body region with a relatively small forward voltage drop associated with the Schottky diode 2645, 2845 and the PN junction diode(s) 2646, 2846, 2847. On the other hand, when the body potential transitions to a negative voltage, the isolation structure potential is held up by the reverse breakdown voltage of the Schottky diode 2645, 2845 and/or the PN junction diode(s) 2646, 2846, 2847 (e.g., between about −0.3 volts to about −14.0 volts or more). As with the embodiment previously discussed in conjunction with FIG. 16, by holding up the potential of the isolation structure when the body potential goes negative, carrier injection into the substrate that may otherwise occur if the body and isolation structure were merely shorted may be reduced or eliminated, thus avoiding disruption of adjacent circuit blocks.

Figure 29:
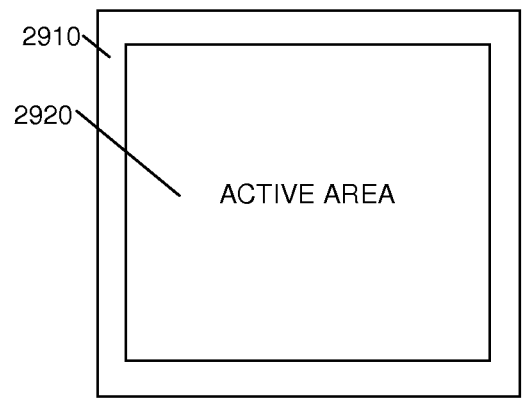
FIG. 29 is a simplified top-view of a ring-shaped configuration of a sinker region, a Schottky contact, or a P-type region of a PN junction diode that extends all the way across the sinker region at the substrate top surface, according to various embodiments.

As discussed previously, various regions of the embodiments of PLDMOSFETs discussed above may have a ring-shaped configuration. For example, the sinker regions (e.g., sinker regions 222, 622, 722, 1122, 1322, 1622, 2022, 2122, 2522, 2722, FIGS. 2, 6, 7, 11, 13, 16, 20, 21, 25, and 27) may have a ring-shaped configuration that substantially surrounds the active area of the device, and the corresponding Schottky contacts (e.g., Schottky contacts 246, 1145, 1345, 1646, 2545, 2745, FIGS. 2, 11, 13, 16, 25, 27) and/or P-type regions (e.g., P-type regions 646, 1146, 1346, 1347, 2046, 2546, 2746, 2747, FIGS. 6, 11, 13, 20, 25, 27) associated with the Schottky and PN junction diodes also may have ring-shaped configurations. For example, FIG. 29 is a simplified top-view of a ring-shaped configuration 2910 of a sinker region (e.g., sinker region 222, 622, 722, 1122, 1322, 1622, 2022, 2122, 2522, 2722, FIGS. 2, 6, 7, 11, 13, 16, 20, 21, 25, and 27), a Schottky contact (e.g., Schottky contact 246, 1145, 1345, 1646, 2545, 2745, FIGS. 2, 11, 13, 16, 25, 27), or a P-type region of a PN junction diode that extends all the way across the sinker region (e.g., P-type region 646, 2046, FIGS. 6, 20), according to various embodiments. As shown, the sinker region, Schottky contact, or P-type region substantially surrounds the active area 2920 of the device. In alternate embodiments, the sinker region, Schottky contact, or P-type region may not fully surround the active area 2920 of the device. For example, although the sinker region may substantially surround the active area 2920 of the device, the Schottky contact may contact only a portion (or portions) of the top surface of the sinker region. Similarly, the P-type region may be present around only a portion (or portions) of the top surface of the sinker region.

Figure 30:
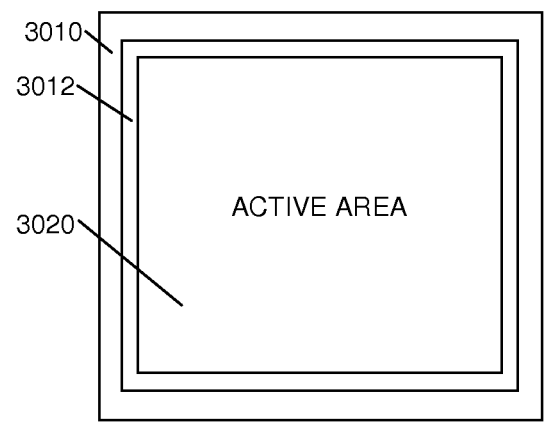
FIG. 30 is a simplified top-view of a ring-shaped configuration of a sinker region and a P-type region of a PN junction diode that does not extend all the way across the sinker region at the substrate top surface, according to an embodiment.

As discussed above, in some embodiments, the P-type region of a PN junction diode may not extend all the way across the sinker region (e.g., P-type region 1146, 2546, FIGS. 11, 25). In such embodiments, the sinker region, P-type region, and Schottky contact (if one is present) may be concentrically arranged. For example, FIG. 30 is a simplified top-view of a ring-shaped configuration of a sinker region 3010 (e.g., sinker region 1122, 2522, FIGS. 11, 25) and a P-type region 3012 of a PN junction diode that does not extend all the way across the sinker region (e.g., P-type region 1146, 2546, FIGS. 11, 25), according to an embodiment. A Schottky contact (e.g., Schottky contact 1145, 2545, FIGS.

11, 25) may completely or partially overlie the concentrically arranged sinker region 3010 and P-type region 3012. As shown, the sinker region and P-type region substantially surround the active area 3020 of the device. In alternate embodiments, the sinker region and/or P-type region may not fully surround the active area 3020 of the device. For example, although the sinker region may substantially surround the active area 3020 of the device, the P-type region may be present around only a portion (or portions) of the sinker region.

Figure 31:
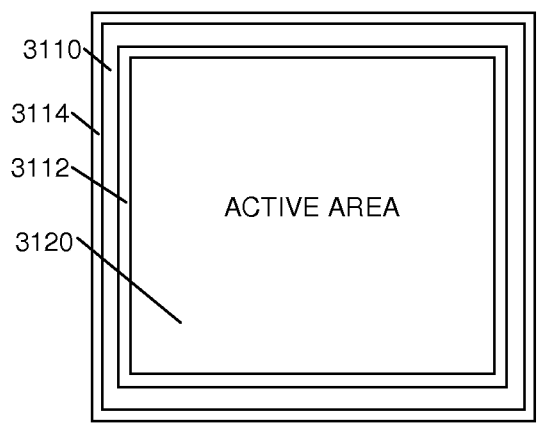
FIG. 31 is a simplified top-view of a ring-shaped configuration of a sinker region, a first P-type region of a first PN junction diode, and a second P-type region of a second PN junction diode, according to an embodiment.

As also discussed above, in other embodiments two P-type regions associated with two PN junction diodes may be included at opposed walls of the sinker region, where the P-type regions do not extend all the way across the sinker region (e.g., P-type regions 1346, 1347, 2746, 2747, FIGS. 13, 27). In such other embodiments, the sinker region, P-type regions, and Schottky contact (if one is present) also may be concentrically arranged. For example, FIG. 31 is a simplified top-view of a ring-shaped configuration of a sinker region 3110 (e.g., sinker region 1322, 2722, FIGS. 13, 27), a first P-type region 3112 of a first PN junction diode (e.g., P-type region 1346, 2746, FIGS. 13, 27), and a second P-type region 3114 of a second PN junction diode (e.g., P-type region 1347, 2747, FIGS. 13, 27), according to an embodiment. A Schottky contact (e.g., Schottky contact 1345, 2745, FIGS. 13, 27) may completely or partially overlie the concentrically arranged sinker region 3110 and P-type regions 3112, 3114. As shown, the sinker region and P-type regions substantially surround the active area 3120 of the device. In alternate embodiments, the sinker region and/or P-type regions may not fully surround the active area 3120 of the device. For example, although the sinker region may substantially surround the active area 3120 of the device, either or both P-type regions may be present around only a portion (or portions) of the sinker region.

Figure 32:
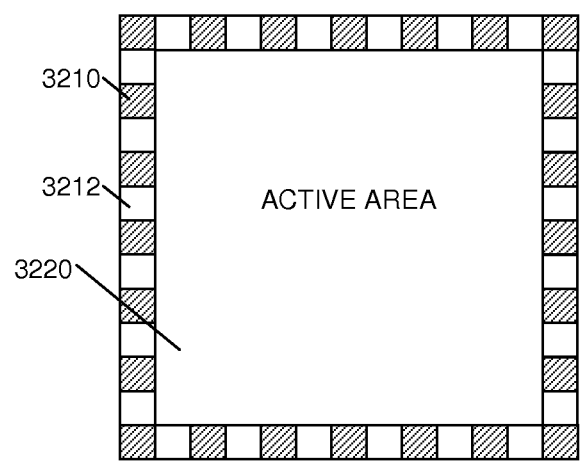
FIG. 32 is a simplified top-view of a configuration of Schottky contacts and P-type regions arranged in an alternating arrangement around a ring-shaped sinker region that surrounds the active area of a device, according to another alternate embodiment.

In still other embodiments that include a combination of Schottky contacts and PN junction diodes in contact with the isolation structures (or more specifically the sinker regions), the Schottky contacts and P-type regions associated with the PN junction diodes may be placed in an alternating arrangement around a ring-shaped sinker region. For example, FIG. 32 is a simplified top-view of a configuration of Schottky contacts 3210 and P-type regions 3212 arranged in an alternating arrangement around a ring-shaped sinker region that surrounds the active area 3220 of a device, according to another alternate embodiment. In all embodiments illustrated in the figures and discussed herein that include both a Schottky diode and one or more PN junction diodes constructed using the sinker region, the P-type anode regions of the PN diodes do not need to intersect the semiconductor surface, nor do they need to physically form one or more larger connected regions. In various embodiments, it is sufficient that the P-type anode regions of the PN junction diodes are capable of being electrically accessed (e.g., through sidewall contacts or buried diffusions) and connected to form series and/or parallel combinations with the Schottky diodes.

Figure 33:
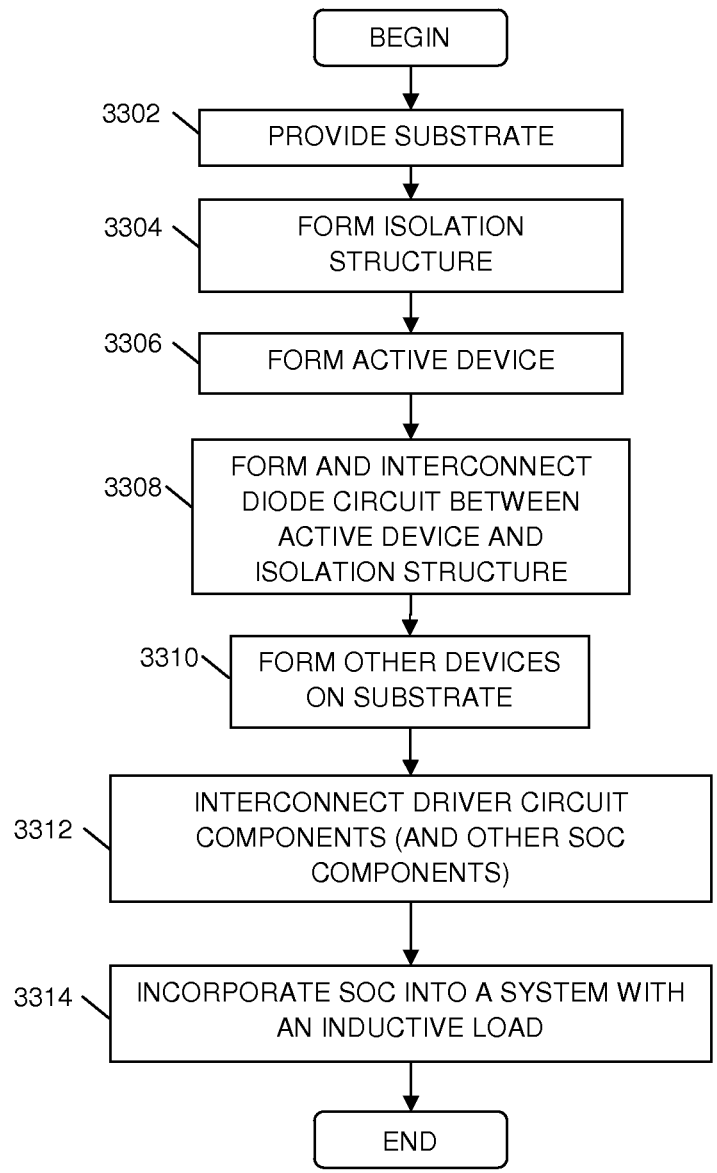
FIG. 33 is a simplified flow diagram illustrating a method for forming the devices illustrated in FIGS. 2, 6 7, 11, 13, 16, 20, 21, 25, and 27 and incorporating those devices into a system with an inductive load, according to various embodiments.

FIG. 33 is a simplified flow diagram illustrating a method for forming the devices illustrated, for example in FIGS. 2, 6 7, 11, 13, 16, 20, 21, 25, and 27, and incorporating those devices into an SOC and a system (e.g., system 100, 1500, FIGS. 1, 15) with an inductive load (e.g., inductive load 132, FIGS. 1, 15), according to various embodiments. Standard semiconductor processing techniques may be employed in producing the SOC, and for the purpose of brevity, those techniques are not described in detail herein.

The method begins, in block 3302, by providing a substrate (e.g., an SOC substrate) having a first conductivity type (e.g., P-type substrate 210, 610, 710, 1110, 1310, 1610, 2010, 2110, 2510, 2710). The substrate may include a base substrate and an epitaxial layer grown on the base substrate, for example. An active device (e.g., associated with a driver circuit) may then be formed (blocks 3304, 3306, 3308). For example, in block 3304, an isolation structure may be formed in the substrate. As described in detail previously, the isolation structure may include a buried layer of a second conductivity type (e.g., NBL 220, 620, 720, 1120, 1320, 1620, 2020, 2120, 2520, 2720) and a sinker region of the second conductivity type (e.g., sinker region 222, 622, 722, 1122, 1322, 1622, 2022, 2122, 2522, 2722) extending from the substrate top surface to the buried layer. The isolation structure formed from the combination of the buried layer and sinker region may substantially surround an active area of the device (e.g., active area 230, 630, 730, 1130, 1330, 1630, 2030, 2130, 2530, 2730). In block 3306, an active device may be formed within the active area. For example, an active device formed in the active area may include a drift region of the first conductivity type, a body region of the second conductivity type, a drain region of the first conductivity type, a source region of the first conductivity type, and a gate electrode (and corresponding gate dielectric), as previously described.

In block 3308, a diode circuit (e.g., diode circuit 162, 1562, FIGS. 1, 15) may be formed and interconnected between the active device and the isolation structure (or more specifically the sinker region, such as sinker region 222, 622, 722, 1122, 1322, 1622, 2022, 2122, 2522, 2722). For example, in the embodiments associated with FIGS. 1-14, a diode circuit is formed and interconnected between the device's source region (e.g., source region 238, 638, 738, 1138, 1338) and the isolation structure. Conversely, in the embodiments associated with FIGS. 15-28, a diode circuit is formed and interconnected between the device's body region (e.g., body region 1634, 2034, 2134, 2534, 2734) and the isolation structure. As described in detail above in conjunction with FIGS. 2-32, embodiments of diode circuits may include one or more Schottky diodes, PN junction diodes, and resistive networks.

In block 3310, which may be performed in parallel with blocks 3304, 3306, and 3308, "other devices" may be formed in and on the substrate, including forming additional devices associated with a driver circuit (e.g., driver circuits 110, 1510, FIGS. 1, 15) and additional devices associated with a system on a chip (SOC) (e.g., processing components, memory arrays, and other circuitry). The driver circuit and other SOC components may be interconnected, in block 3312, and the SOC substrate may be packaged, thus completing fabrication of the SOC. In block 3314, the SOC, whether packaged or not, may be incorporated into a larger system, such as a system that includes an inductive load (e.g., inductive loads 132, 1532, FIGS. 1, 15), and the method may end.

As discussed previously, the device formed in blocks 3304, 3306, and 3308 is configured to reduce or eliminate current injection into the SOC substrate under various operating conditions. More particularly, the diode circuit coupled between the source or body region and the isolation structure of at least one active device of the driver circuit may result in reduction or elimination of injection current, when compared with other systems in which such a diode circuit is not present (e.g., in systems in which the source region, body region, and isolation structure are merely shorted together). Accordingly, the various embodiments may produce significant advantageous results.

While at least one exemplary embodiment has been presented in the foregoing detailed description, it should be appreciated that a vast number of variations exist, especially with respect to choices of device types, materials and doping.

It should be appreciated that the exemplary embodiment or exemplary embodiments are only examples, and are not intended to limit the scope, applicability, or configuration of the embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A semiconductor device, comprising:
a semiconductor substrate having a first conductivity type and a top substrate surface;
a buried layer below the top substrate surface, wherein the buried layer has a second conductivity type that is different from the first conductivity type;
a sinker region between the top substrate surface and the buried layer, wherein the sinker region has the second conductivity type, and an isolation structure is formed by the sinker region and the buried layer;
an active device in a portion of the semiconductor substrate contained by the isolation structure, wherein the active device includes
a body region of the second conductivity type, wherein the body region and the isolation structure are separated by a portion of the semiconductor substrate having the first conductivity type, and
a source region of the first conductivity type formed in the body region; and
a diode circuit connected between the isolation structure and the body region.

2. The semiconductor device of claim 1, wherein the diode circuit comprises:
a Schottky diode formed from a Schottky contact coupled with the isolation region.

3. The semiconductor device of claim 2, wherein the diode circuit further comprises:
a resistive network in series with the Schottky diode.

4. The semiconductor device of claim 2, wherein the diode circuit further comprises:
a resistive network in series with the Schottky diode; and
a resistive network in parallel with the Schottky diode.

5. The semiconductor device of claim 1, further comprising:
a further region of the first conductivity type extending into the sinker region, wherein the diode circuit comprises a PN junction diode formed between the further region and the sinker region.

6. The semiconductor device of claim 1, wherein the diode circuit comprises a polycrystalline silicon diode interconnected between the body region and the sinker region.

7. The semiconductor device of claim 1, wherein the active device further comprises:
a drift region of the first conductivity type within a central portion of the active area and extending from the top substrate surface into the semiconductor substrate; and
a drain region of the first conductivity type extending into the drift region from the top substrate surface.

8. A semiconductor device, comprising:
a semiconductor substrate having a first conductivity type and a top substrate surface;
a buried layer below the top substrate surface, wherein the buried layer has a second conductivity type that is different from the first conductivity type;
a sinker region between the top substrate surface and the buried layer, wherein the sinker region has the second conductivity type, and an isolation structure is formed by the sinker region and the buried layer;
an active device in a portion of the semiconductor substrate contained by the isolation structure, wherein the active device includes a body region of the second conductivity type, wherein the body region and the isolation structure are separated by a portion of the semiconductor substrate having the first conductivity type; and
a diode circuit connected between the isolation structure and the body region, wherein the diode circuit includes
a Schottky diode formed from a Schottky contact coupled with the isolation region, and
a resistive network in parallel with the Schottky diode between the isolation structure and the body region.

* * * * *